United States Patent
Chen et al.

(10) Patent No.: US 10,867,933 B2
(45) Date of Patent: Dec. 15, 2020

(54) METHOD FOR FORMING SEMICONDUCTOR DEVICE STRUCTURE WITH OVERLAY GRATING

(71) Applicant: Taiwan Semiconductor Manufacturing Co., Ltd., Hsinchu (TW)

(72) Inventors: Long-Yi Chen, Changhua County (TW); Jia-Hong Chu, Hsinchu (TW); Chi-Wen Lai, Kaohsiung (TW); Chia-Ching Liang, Hualien County (TW); Kai-Hsiung Chen, New Taipei (TW); Yu-Ching Wang, Tainan (TW); Po-Chung Cheng, Chiayi County (TW); Hsin-Chin Lin, Yunlin County (TW); Meng-Wei Chen, Taichung (TW); Kuei-Shun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/983,625

(22) Filed: Aug. 3, 2020

(65) Prior Publication Data
US 2020/0365520 A1 Nov. 19, 2020

Related U.S. Application Data

(63) Continuation of application No. 16/662,970, filed on Oct. 24, 2019, now Pat. No. 10,734,325, which is a
(Continued)

(51) Int. Cl.
*H01L 23/544* (2006.01)
*H01L 21/033* (2006.01)
(Continued)

(52) U.S. Cl.
CPC ........ *H01L 23/544* (2013.01); *G03F 7/70633* (2013.01); *G03F 9/7076* (2013.01);
(Continued)

(58) Field of Classification Search
CPC ............... H01L 22/12; H01L 21/67259; H01L 21/0338; H01L 21/0337; H01L 21/76816;
(Continued)

(56) References Cited

U.S. PATENT DOCUMENTS

| 6,261,918 B1 * | 7/2001 | So | G03F 9/708 |
| | | | 257/E23.179 |
| 6,420,791 B1 * | 7/2002 | Huang | H01L 23/544 |
| | | | 257/750 |

(Continued)

*Primary Examiner* — Errol V Fernandes
*Assistant Examiner* — Jeremy J Joy
(74) *Attorney, Agent, or Firm* — Birch, Stewart, Kolasch & Birch, LLP

(57) ABSTRACT

A method for forming a semiconductor device structure is provided. The method includes forming a first overlay grating over a substrate. The first overlay grating has a first strip portion and a second strip portion, and the first strip portion and the second strip portion are elongated in a first elongated axis and are spaced apart from each other. The method includes forming a layer over the first overlay grating. The layer has a first trench elongated in a second elongated axis, the second elongated axis is substantially perpendicular to the first elongated axis, and the first trench extends across the first strip portion and the second strip portion. The method includes forming a second overlay grating over the layer. The second overlay grating has a third strip portion and a fourth strip portion.

20 Claims, 20 Drawing Sheets

Related U.S. Application Data continuation of application No. 15/797,953, filed on Oct. 30, 2017, now Pat. No. 10,461,037.

(51) Int. Cl.

| | | |
|---|---|---|
| *H01L 21/67* | (2006.01) | |
| *H01L 21/66* | (2006.01) | |
| *H01L 21/768* | (2006.01) | |
| *G03F 7/20* | (2006.01) | |
| *G03F 9/00* | (2006.01) | |

(52) U.S. Cl.
CPC ........ *G03F 9/7084* (2013.01); *H01L 21/0337* (2013.01); *H01L 21/0338* (2013.01); *H01L 21/67259* (2013.01); *H01L 22/12* (2013.01); *H01L 22/30* (2013.01); *H01L 21/76816* (2013.01); *H01L 21/76877* (2013.01); *H01L 2223/5446* (2013.01); *H01L 2223/54426* (2013.01)

(58) Field of Classification Search
CPC ............. H01L 21/76877; H01L 23/544; H01L 2223/54426; H01L 2223/5446; G03F 7/70633; G03F 7/70625; G03F 9/7076; G03F 9/7084
See application file for complete search history.

(56) References Cited

U.S. PATENT DOCUMENTS

| | | | |
|---|---|---|---|
| 7,061,615 B1* | 6/2006 | Lowe-Webb | G02B 27/4255 257/797 |
| 8,716,841 B1 | 5/2014 | Chang et al. | |
| 8,736,084 B2* | 5/2014 | Cheng | G03F 7/70633 257/797 |
| 8,796,666 B1 | 8/2014 | Huang et al. | |
| 8,837,810 B2 | 9/2014 | Chen et al. | |
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 2002/0048928 A1* | 4/2002 | Nakagawa | H01L 23/544 438/619 |
| 2003/0002043 A1* | 1/2003 | Abdulhalim | G01B 11/26 356/400 |
| 2003/0127751 A1* | 7/2003 | Yamada | H01L 23/544 257/797 |
| 2004/0043310 A1* | 3/2004 | Takeishi | G03F 9/708 430/22 |
| 2004/0114143 A1* | 6/2004 | Van Haren | G03F 9/7046 356/401 |
| 2004/0246482 A1* | 12/2004 | Sezginer | G01N 21/4788 356/401 |
| 2005/0110012 A1* | 5/2005 | Lee | H01L 23/544 257/48 |
| 2007/0090548 A1* | 4/2007 | Chia | G03F 9/7084 257/797 |
| 2008/0002213 A1* | 1/2008 | Weiss | G03F 9/7084 356/620 |
| 2013/0256659 A1* | 10/2013 | Tsai | H01L 22/12 257/48 |
| 2014/0362363 A1* | 12/2014 | Cai | G03F 7/70133 355/77 |
| 2015/0061016 A1* | 3/2015 | Chiang | H01L 21/32139 257/347 |
| 2015/0147882 A1* | 5/2015 | Yao | H01L 21/76805 438/675 |
| 2016/0056152 A1* | 2/2016 | Okuno | G03F 9/708 257/350 |
| 2016/0117847 A1* | 4/2016 | Pandev | G03F 7/70633 348/87 |
| 2016/0300767 A1* | 10/2016 | Ko | G03F 7/70633 |
| 2017/0235228 A1* | 8/2017 | Chandhok | H01L 21/0277 355/27 |
| 2017/0357154 A1* | 12/2017 | Oh | G03F 7/70633 |
| 2018/0175016 A1* | 6/2018 | Kim | G03F 7/70633 |

* cited by examiner

METHOD FOR FORMING SEMICONDUCTOR DEVICE STRUCTURE WITH OVERLAY GRATING

CROSS REFERENCE

This application is a Continuation of U.S. application Ser. No. 16/662,970, filed on Oct. 24, 2019, which is a Continuation of U.S. application Ser. No. 15/797,953, filed on Oct. 30, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. For example, since feature sizes continue to decrease, there is a need to improve overlay accuracy between layers of a semiconductor device.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
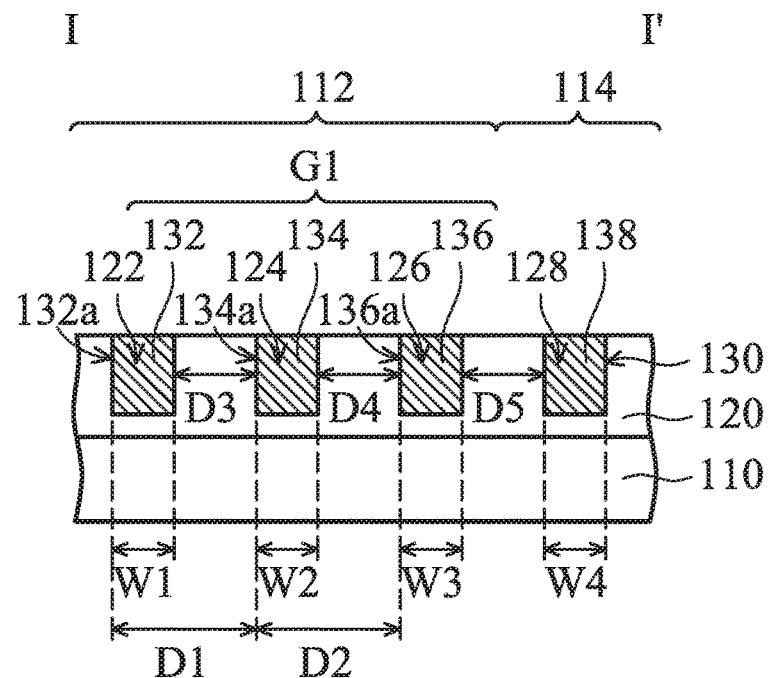
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1A-1G are cross-sectional views of various stages of a process for forming a semiconductor device structure, in accordance with some embodiments. FIGS. 2A-2G are top views of the semiconductor device structures of FIGS.

1A-1G, in accordance with some embodiments. FIGS. 1A-1G are cross-sectional views illustrating the semiconductor device structures along a sectional line I-I' in FIGS. 2A-2G, in accordance with some embodiments. FIGS. 3A-3E are cross-sectional views illustrating the semiconductor device structures along a sectional line II-II' in FIGS. 2C-2F, in accordance with some embodiments.

As shown in FIG. 1A, a substrate 110 is provided. The substrate 110 has regions 112 and 114, in accordance with some embodiments. The region 112 may be referred to as an overlay measurement region. The region 114 may be referred to as a device region. The region 112 may be a scribe line region of a wafer (e.g., the substrate 110), and the structures formed in the region 112 may be removed in a wafer cutting process. In some other embodiments, the region 112 is in a chip region, and the structures formed in the region 112 remain after a wafer cutting process.

In some embodiments, the substrate 110 is a bulk semiconductor substrate, such as a semiconductor wafer. For example, the substrate 110 is a silicon wafer. The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 110. The device elements are not shown in figures for the purpose of simplicity and clarity. Examples of the various device elements include transistors, diodes, another suitable element, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

In some embodiments, an interconnection structure (not shown) is formed over the substrate 110. The interconnection structure includes multiple dielectric layers containing an interlayer dielectric (ILD) layer and one or more intermetal dielectric (IMD) layers. The interconnection structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnection structure.

Figure 2A:
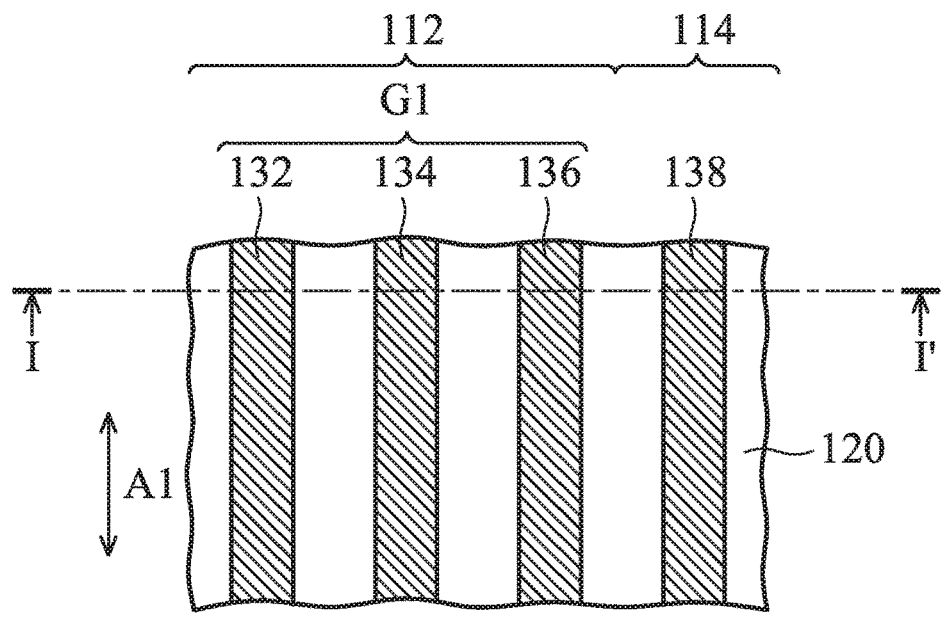
FIGS. 2A-2G are top views of the semiconductor device structures of FIGS. 1A-1G, in accordance with some embodiments.

Various device elements are interconnected through the interconnection structure over the substrate 110 to form integrated circuit devices, in accordance with some embodiments. As shown in FIGS. 1A and 2A, a dielectric layer 120 is deposited over the substrate 110, in accordance with some embodiments. The dielectric layer 120 may serve as an ILD or IMD layer of an interconnection structure. The dielectric layer 120 covers device elements formed in and/or over the substrate 110, in accordance with some embodiments.

Although FIG. 1A shows that the dielectric layer 120 is a single layer, embodiments of the disclosure are not limited thereto. In some other embodiments, the dielectric layer 120 is a multi-layer structure including dielectric sub-layers (not shown).

In some embodiments, the dielectric layer 120 is made of or includes an insulating material, such as silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 120 is deposited using a chemical vapor deposition (CVD) process, an atomic layer deposition (ALD) process, a spin-on process, a spray coating process, one or more other applicable processes, or a combination thereof.

Multiple conductive features (not shown) are formed in the dielectric layer 120, in accordance with some embodiments. The conductive features may be electrically connected to gate structures or power devices formed on the substrate 110 or doped regions formed in the substrate 110. The conductive features may include conductive lines, conductive vias, conductive contacts, or a combination thereof.

In some embodiments, the conductive features are made of or include conductive materials, such as metal materials (e.g., copper, aluminum, tungsten, titanium, cobalt, nickel, gold, platinum, or a combination thereof). Various processes, including deposition, etching, planarization, or the like, may be used to form the conductive features in the dielectric layer 120.

As shown in FIGS. 1A and 2A, portions of the dielectric layer 120 are removed to form trenches 122, 124, 126, and 128 in the dielectric layer 120, in accordance with some embodiments. The removal process includes a photolithography process and an etching process, in accordance with some embodiments.

As shown in FIGS. 1A and 2A, a material layer 130 is formed in the trenches 122, 124, 126, and 128, in accordance with some embodiments. The material layer 130 in the trenches 122, 124, and 126 forms an overlay grating G1, in accordance with some embodiments. The overlay grating G1 has strip portions 132, 134, and 136 respectively in the trenches 122, 124, and 126, in accordance with some embodiments.

The material layer 130 in the trench 128 forms a strip structure 138, in accordance with some embodiments. The overlay grating G1 is used to measure overlay between the material layer 130 and the other layer, in accordance with some embodiments. The strip structure 138 is used to be a device element in the region (or the device region) 114, in accordance with some embodiments.

The strip portions 132, 134, and 136 and the strip structure 138 are elongated in a first elongated axis A1, in accordance with some embodiments. The strip portions 132, 134, and 136 and the strip structure 138 are substantially parallel to each other, in accordance with some embodiments. The term "substantially parallel to" means the angle between the two features (e.g., two of the strip portions 132, 134, and 136 and the strip structure 138) ranges from about 5° to about −5°, in accordance with some embodiments. The term "substantially parallel to" means the angle between the two features (e.g., two of the strip portions 132, 134, and 136 and the strip structure 138) ranges from about 2° to about −2°, in accordance with some embodiments. The strip portions 132, 134, and 136 and the strip structure 138 are spaced apart from each other, in accordance with some embodiments.

There is a distance D1 between a sidewall 132*a* of the strip portion 132 and a sidewall 134*a* of the strip portion 134, in accordance with some embodiments. The sidewall 132*a* faces away from the strip portion 134, in accordance with some embodiments. The sidewall 134*a* faces the strip portion 132, in accordance with some embodiments.

There is a distance D2 between a sidewall 134*a* of the strip portion 134 and a sidewall 136*a* of the strip portion 136, in accordance with some embodiments. The sidewall 134*a* faces away from the strip portion 136, in accordance with some embodiments. The sidewall 136*a* faces the strip portion 134, in accordance with some embodiments.

The distance D1 is substantially equal to the distance D2, in accordance with some embodiments. The term "substantially equal to" means "within 5%", in accordance with some embodiments. For example, the term "substantially equal to" means the difference between the distances D1 and D2 is within 5% of the average distance between the strip portions 132, 134, and 136, in accordance with some embodiments.

The distance D1 is also referred to as a pitch between the strip portions 132 and 134, in accordance with some embodiments. The distance D2 is also referred to as a pitch between the strip portions 134 and 136, in accordance with some embodiments. The sidewalls 132*a*, 134*a*, and 136*a* are substantially parallel to each other, in accordance with some embodiments.

The distance D3 between the strip portions 132 and 134, the distance D4 between the strip portions 134 and 136, and the distance D5 between the strip portion 136 and the strip structure 138 are substantially equal to each other, in accordance with some embodiments. The widths W1, W2, W3, and W4 of the strip portions 132, 134, and 136 and the strip structure 138 are substantially equal to each other, in accordance with some embodiments. The widths W1, W2, W3, and W4 are also referred to as line widths of the strip portions 132, 134, and 136 and the strip structure 138, in accordance with some embodiments.

The strip portions 132, 134, and 136 and the strip structure 138 are made of the same material, in accordance with some embodiments. The material layer 130 is made of a conductive material, an insulating material, a dielectric material, a semiconductor material, or another material which is suitable to be formed over the substrate 110. The material layer 130 is formed using a physical vapor deposition process, a chemical vapor deposition process, a plating process, a spin coating process, or another process which is suitable to be performed over the substrate 110.

Figure 1B:
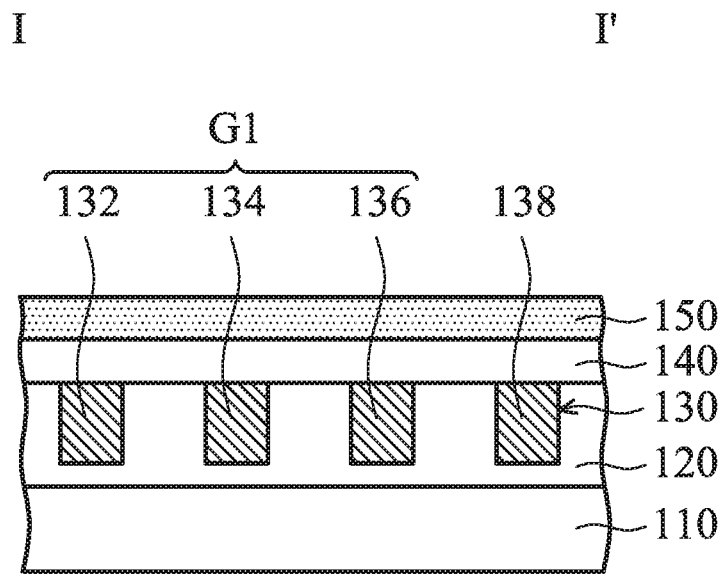
Figure 2B:
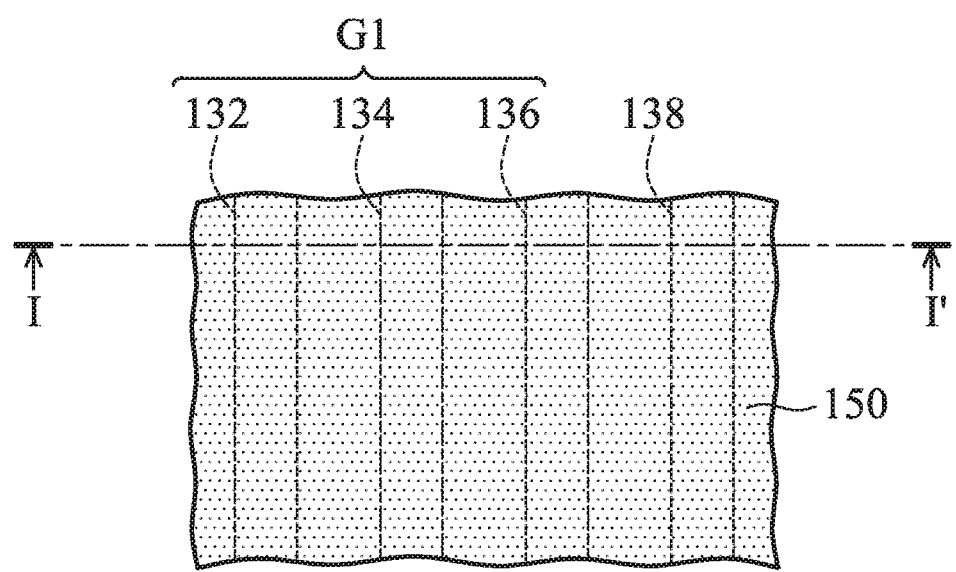

As shown in FIGS. 1B and 2B, a layer 140 is formed over the material layer 130 (including the overlay grating G1) and the dielectric layer 120, in accordance with some embodiments. The layer 140 is made of an insulating material, a conductive material, a dielectric material, a semiconductor material, or another material which is suitable to be formed over the substrate 110. The layer 140 is formed using a chemical vapor deposition process, a physical vapor deposition process, a plating process, a spin coating process, or another process which is suitable to be performed over the substrate 110.

As shown in FIGS. 1B and 2B, a layer 150 is formed over the layer 140, in accordance with some embodiments. In some embodiments, the light transmittance of the layer 150 at with a wavelength ranging from about 400 nm to about 800 nm is substantially lower than 40%. The light transmittance of the layer 150 at with a wavelength ranging from about 400 nm to about 800 nm is substantially lower than 30%, in accordance with some embodiments. The light transmittance of the layer 150 at with a wavelength ranging from about 400 nm to about 800 nm is substantially lower than 50%, in accordance with some embodiments. The light transmittance of the layer 150 is lower than the light transmittance of the layer 140 at a wavelength ranging from about 400 nm to about 800 nm, in accordance with some embodiments.

The layer 150 is made of amorphous silicon, carbon, carbide, or carbon compound, in accordance with some embodiments. The layer 150 is made of an insulating material, a conductive material, a dielectric material, a semiconductor material, or another material which is suitable to be formed over the substrate 110. The layer 150 is formed using a chemical vapor deposition process, a physical vapor deposition process, a plating process, a spin coating process, or another process which is suitable to be performed over the substrate 110.

Figure 1C:
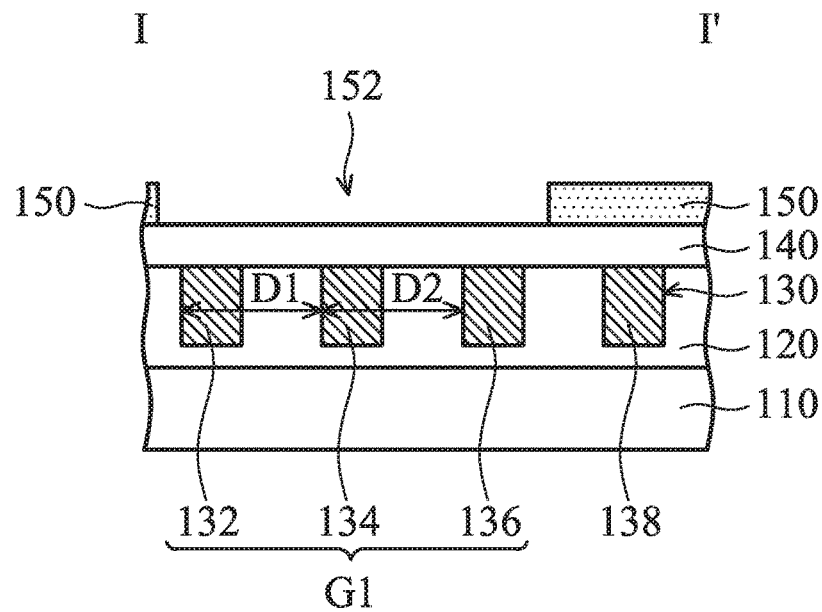
Figure 2C:
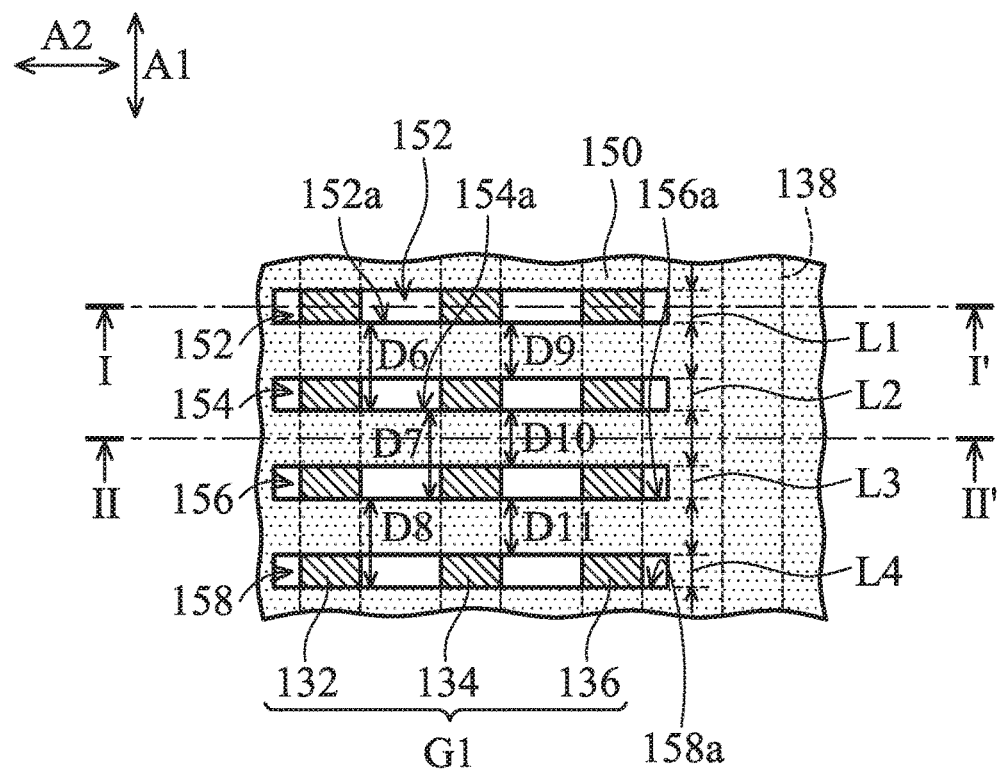
Figure 3A:
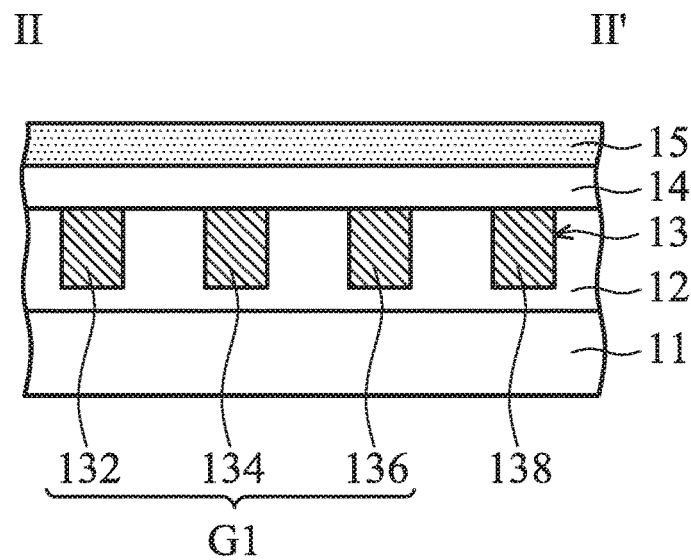
FIGS. 3A-3E are cross-sectional views illustrating the semiconductor device structures along a sectional line II-II' in FIGS. 2C-2G, in accordance with some embodiments.

As shown in FIGS. 1C, 2C and 3A, portions of the layer 150 are removed to form trenches 152, 154, 156, and 158 in the layer 150, in accordance with some embodiments. For the sake of simplicity, FIG. 2C does not show the layer 140, in accordance with some embodiments. The trenches 152, 154, 156, and 158 pass through the layer 150 and expose the layer 140 thereunder, in accordance with some embodiments. The trenches 152, 154, 156, and 158 are in a line shape, such a straight line shape, in accordance with some embodiments.

The trenches 152, 154, 156, and 158 are elongated in a second elongated axis A2, in accordance with some embodiments. The second elongated axis A2 is not parallel to the first elongated axis A1, in accordance with some embodiments. The second elongated axis A2 is substantially perpendicular to the first elongated axis A1, in accordance with some embodiments.

The term "substantially perpendicular to" means the angle between the two features (e.g., the first elongated axis A1 and the second elongated axis A2) ranges from about 85° to about 95°, in accordance with some embodiments. In some embodiments, the term "substantially perpendicular to" means the angle between the two features (e.g., the first elongated axis A1 and the second elongated axis A2) ranges from about 88° to about 92°, in accordance with some embodiments. The trenches 152, 154, 156, and 158 are substantially parallel to each other, in accordance with some embodiments. The trench 152, 154, 156, or 158 extends across the strip portions 132, 134, and 136, in accordance with some embodiments.

In some embodiments, there is a distance D6 between an inner wall 152*a* of the trench 152 and an inner wall 154*a* of the trench 154. The inner wall 152*a* faces away from the trench 154, in accordance with some embodiments. The inner wall 154*a* faces the trench 152, in accordance with some embodiments. The distance D6 is less than the distance D1 or D2, in accordance with some embodiments.

In some embodiments, there is a distance D7 between an inner wall 154*a* of the trench 154 and an inner wall 156*a* of the trench 156. The inner wall 154*a* faces away from the trench 156, in accordance with some embodiments. The inner wall 156*a* faces the trench 154, in accordance with some embodiments. The distance D7 is less than the distance D1 or D2, in accordance with some embodiments.

In some embodiments, there is a distance D8 between an inner wall 156*a* of the trench 156 and an inner wall 158*a* of the trench 158. The inner wall 156*a* faces away from the trench 158, in accordance with some embodiments. The inner wall 158*a* faces the trench 156, in accordance with some embodiments. The inner walls 152*a*, 154*a*, 156*a*, and 158*a* are substantially parallel to each other, in accordance with some embodiments. The distance D8 is less than the distance D1 or D2, in accordance with some embodiments. The distances D6, D7, and D8 are substantially equal to each other, in accordance with some embodiments.

The distance D6 is also referred to as a pitch between the trenches 152 and 154, in accordance with some embodiments. The distance D7 is also referred to as a pitch between the trenches 154 and 156, in accordance with some embodiments. The distance D8 is also referred to as a pitch between the trenches 156 and 158, in accordance with some embodiments.

The distance D9 between the trenches 152 and 154, the distance D10 between the trenches 154 and 156, and the distance D11 between the trenches 156 and 158 are substantially equal to each other, in accordance with some embodiments. The lengths L1, L2, L3, and L4 of the trenches 152, 154, 156, and 158 are substantially equal to each other, in accordance with some embodiments. The length L1, L2, L3, or L4 is less than the width W1, W2, W3, or W4 (as shown in FIG. 1A), in accordance with some embodiments.

Figure 1D:
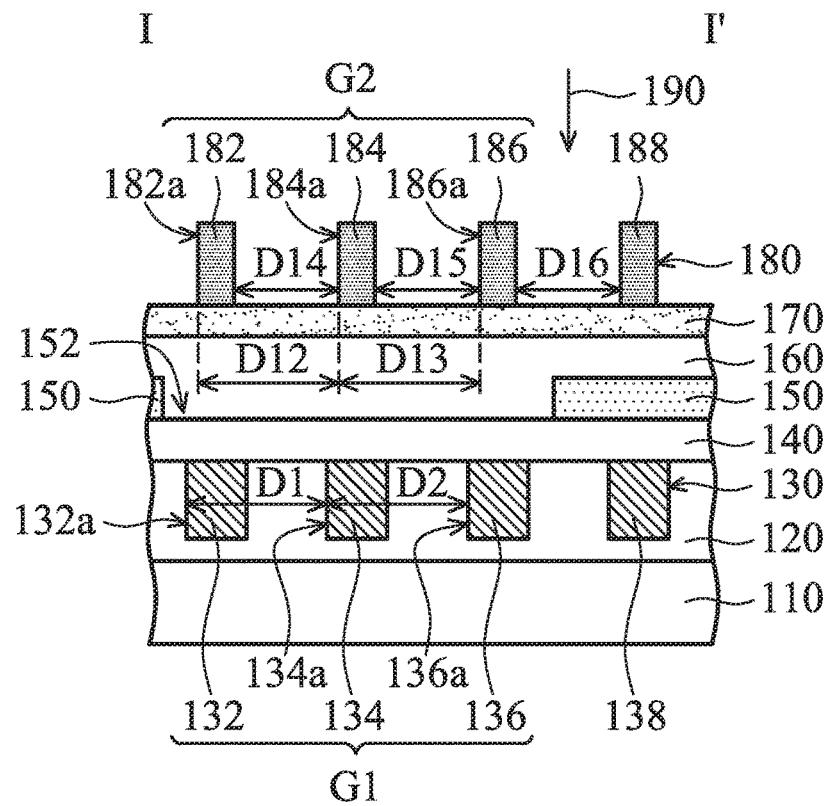
Figure 2D:
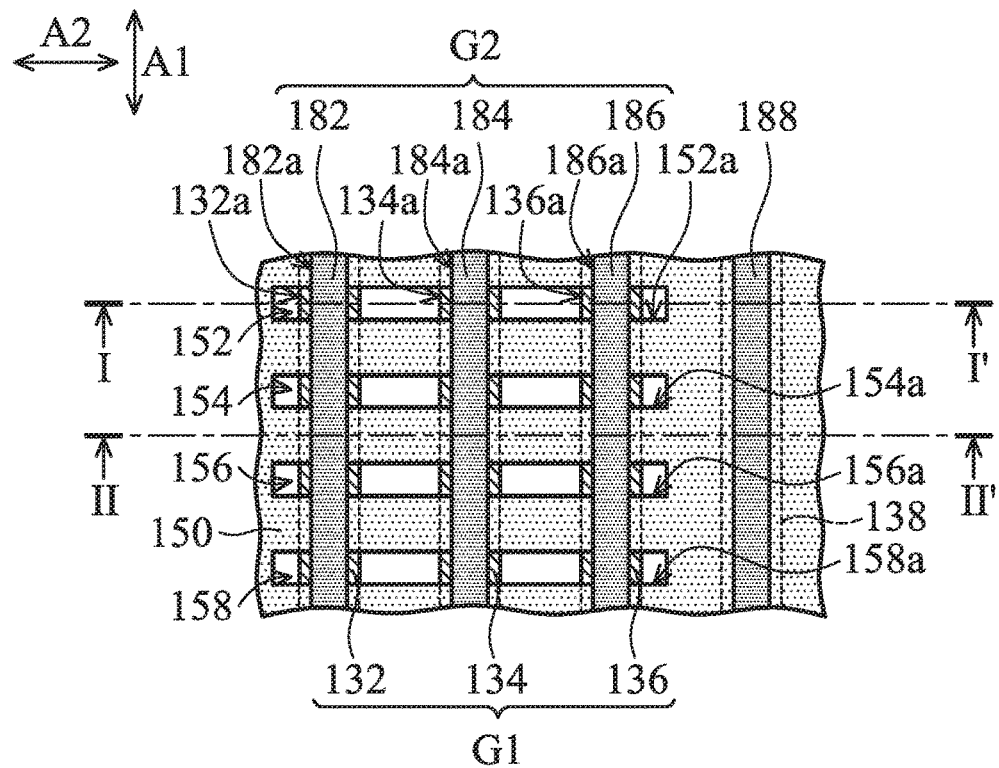
Figure 3B:
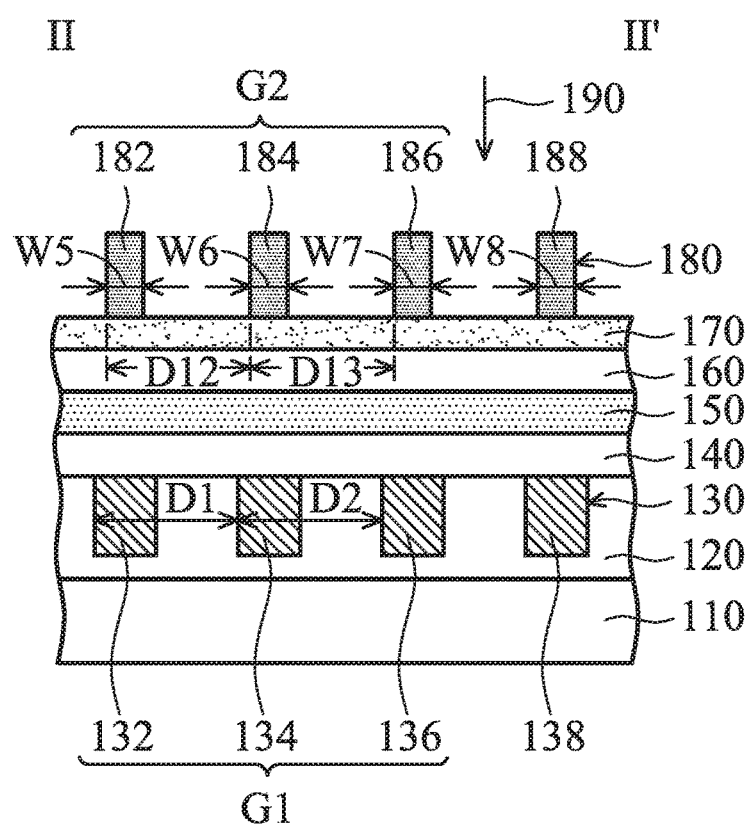

As shown in FIGS. 1D, 2D and 3B, a layer 160 is formed over the layers 140 and 150, in accordance with some embodiments. The layer 160 is made of an insulating material, a conductive material, a dielectric material, a semiconductor material, or another material which is suitable to be formed over the substrate 110. The layer 160 is formed using a chemical vapor deposition process, a physical vapor deposition process, a plating process, a spin coating process, or another process which is suitable to be performed over the substrate 110.

As shown in FIGS. 1D, 2D and 3B, a layer 170 is formed over the layer 160, in accordance with some embodiments. For the sake of simplicity, FIG. 2D does not show the layers 140, 160, and 170, in accordance with some embodiments. The layer 170 is made of an insulating material, a conductive material, a dielectric material, a semiconductor material, or another material which is suitable to be formed over the substrate 110. The layer 170 is formed using a chemical vapor deposition process, a physical vapor deposition process, a plating process, a spin coating process, or another process which is suitable to be performed over the substrate 110. The light transmittance of the layer 150 is lower than the light transmittance of the layer 160 or 170 at a wavelength ranging from about 400 nm to about 800 nm, in accordance with some embodiments.

As shown in FIGS. 1D, 2D and 3B, a material layer 180 is formed over the layer 170, in accordance with some embodiments. The material layer 180 includes an overlay grating G2 and a strip structure 188, in accordance with some embodiments. The overlay grating G2 has strip portions 182, 184, and 186, in accordance with some embodiments. The overlay gratings G1 and G2 are used to measure overlay between the material layers 130 and 180, in accordance with some embodiments. The strip structure 188 is used to be a mask for forming a device element, in accordance with some embodiments.

The strip portions 182, 184, and 186 and the strip structure 188 are elongated in the first elongated axis A1, in accordance with some embodiments. The strip portions 182, 184, and 186 and the strip structure 188 are substantially parallel to each other, in accordance with some embodiments. The strip portions 132, 134, 136, 182, 184, and 186 and the strip structures 138 and 188 are substantially parallel to each other, in accordance with some embodiments. The strip portions 132, 134, 136, 182, 184, and 186 and the strip structures 138 and 188 are not parallel to the trenches 152, 154, 156, and 158, in accordance with some embodiments. The strip portions 132, 134, 136, 182, 184, and 186 and the strip structures 138 and 188 are substantially perpendicular to the trenches 152, 154, 156, and 158, in accordance with some embodiments. The strip portions 182, 184, and 186 and the strip structure 188 are spaced apart from each other, in accordance with some embodiments.

There is a distance D12 between a sidewall 182a of the strip portion 182 and a sidewall 184a of the strip portion 184, in accordance with some embodiments. The sidewall 182a faces away from the strip portion 184, in accordance with some embodiments. The sidewall 184a faces the strip portion 182, in accordance with some embodiments.

There is a distance D13 between a sidewall 184a of the strip portion 184 and a sidewall 186a of the strip portion 186, in accordance with some embodiments. The sidewall 184a faces away from the strip portion 186, in accordance with some embodiments. The sidewall 186a faces the strip portion 184, in accordance with some embodiments.

The distance D12 is substantially equal to the distance D13, in accordance with some embodiments. The distance D12 is also referred to as a pitch between the strip portions 182 and 184, in accordance with some embodiments. The distance D13 is also referred to as a pitch between the strip portions 184 and 186, in accordance with some embodiments. The distances (or the pitches) D1, D2, D12, and D13 are substantially equal to each other, in accordance with some embodiments.

The sidewalls 182a, 184a, and 186a are substantially parallel to each other, in accordance with some embodiments. The sidewalls 132a, 134a, 136a, 182a, 184a, and 186a are substantially parallel to each other, in accordance with some embodiments. The sidewalls 132a, 134a, 136a, 182a, 184a, and 186a are substantially perpendicular to the inner walls 152a, 154a, 156a, and 158a of the trenches 152, 154, 156, and 158, in accordance with some embodiments.

The distance D14 between the strip portions 182 and 184, the distance D15 between the strip portions 184 and 186, and the distance D16 between the strip portion 186 and the strip structure 188 are substantially equal to each other, in accordance with some embodiments. The widths W5, W6, W7, and W8 of the strip portions 182, 184, and 186 and the strip structure 188 are substantially equal to each other, in accordance with some embodiments. The widths W5, W6, W7, and W8 are also referred to as line widths of the strip portions 182, 184, and 186 and the strip structure 188, in accordance with some embodiments.

The strip portions 182, 184, and 186 and the strip structure 188 are made of the same material, in accordance with some embodiments. The material layer 180 is made of a photoresist material, in accordance with some embodiments. In some other embodiments, the material layer 180 is made of an insulating material, a dielectric material, a conductive material, a semiconductor material, or another material which is suitable to be formed over the substrate 110.

The material layer 180 is formed using a spin coating process and a photolithography process, in accordance with some embodiments. In some other embodiments, the material layer 180 is formed using a physical vapor deposition process, a chemical vapor deposition process, a plating process, or another process which is suitable to be performed over the substrate 110.

The strip portion 182 overlaps the strip portion 132, in accordance with some embodiments. The strip portion 184 overlaps the strip portion 134, in accordance with some embodiments. The strip portion 186 overlaps the strip portion 136, in accordance with some embodiments. The strip structure 188 overlaps the strip structure 138, in accordance with some embodiments. The strip portions 182, 184, and 186 and the strip structure 188 are respectively and directly over the strip portions 132, 134, and 136 and the strip structure 138, in accordance with some embodiments.

In some embodiments, a first portion of the trench 152 is between the strip portions 132 and 182. In some embodiments, a second portion of the trench 152 is between the strip portions 134 and 184. In some embodiments, a third portion of the trench 152 is between the strip portions 136 and 186. The strip portion 182, 184, or 186 extends across the trenches 152, 154, 156, and 158, in accordance with some embodiments.

As shown in FIGS. 1D, 2D and 3B, after the formation of the overlay grating G2, an optical overlay measurement 190 is performed on the overlay gratings G1 and G2, in accordance with some embodiments. The optical overlay measurement 190 includes a diffraction based overlay measurement or an image based overlay measurement, in accordance with some embodiments.

The diffraction based overlay measurement provides a light beam over the overlay gratings G1 and G2 and detects the diffraction light from the overlay gratings G1 and G2 to perform an overlay analysis.

The image based overlay measurement provides a light beam over the overlay gratings G1 and G2 and detects the reflected light from the overlay gratings G1 and G2 to perform an overlay analysis.

The trenches 152, 154, 156, and 158 of the layer 150, which has a low light transmittance, increase the light passing through the layer 150 during the optical overlay measurement 190, and therefore the formation of the trenches 152, 154, 156, and 158 increases the light illuminating the overlay grating G1 under the layer 150. As a result, the formation of the trenches 152, 154, 156, and 158 increases the diffraction light or the reflected light from the overlay grating G1. Therefore, the formation of the trenches 152, 154, 156, and 158 improves the accuracy of the measurement result of the optical overlay measurement 190.

Furthermore, since the second elongated axis A2 of the trenches 152, 154, 156, and 158 is not parallel to (or substantially perpendicular to) the first elongated axis A1 of the strip portions 132, 134, and 136 of the overlay grating G1 and the strip portions 182, 184, and 186 of the overlay grating G2, the direction of the diffraction light from the trenches 152, 154, 156, and 158 is different from that from the overlay gratings G1 and G2. Therefore, the diffraction light from the trenches 152, 154, 156, and 158 does not affect the detection result of the diffraction light from the overlay gratings G1 and G2.

Since the pitch of the trenches 152, 154, 156, and 158 is different from (or less than) the pitch of the strip portions 132, 134, and 136 of the overlay grating G1 and the pitch of the strip portions 182, 184, and 186 of the overlay grating G2, the diffraction angle of the diffraction light from the trenches 152, 154, 156, and 158 is different from the diffraction angle of the diffraction light from the overlay gratings G1 and G2. Therefore, the diffraction light from the trenches 152, 154, 156, and 158 does not affect the detection result of the diffraction light from the overlay gratings G1 and G2.

Figure 1E:
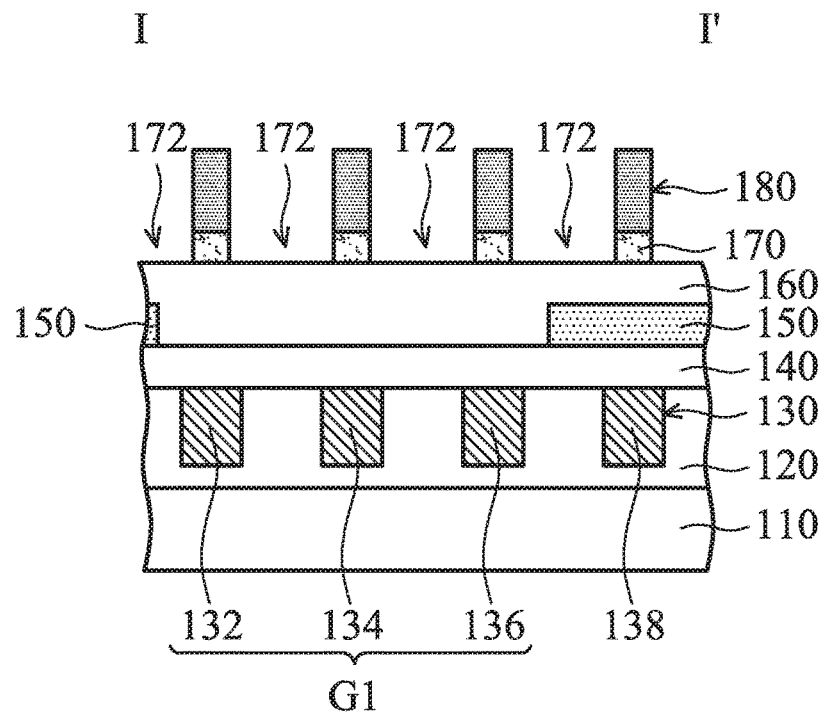
Figure 2E:
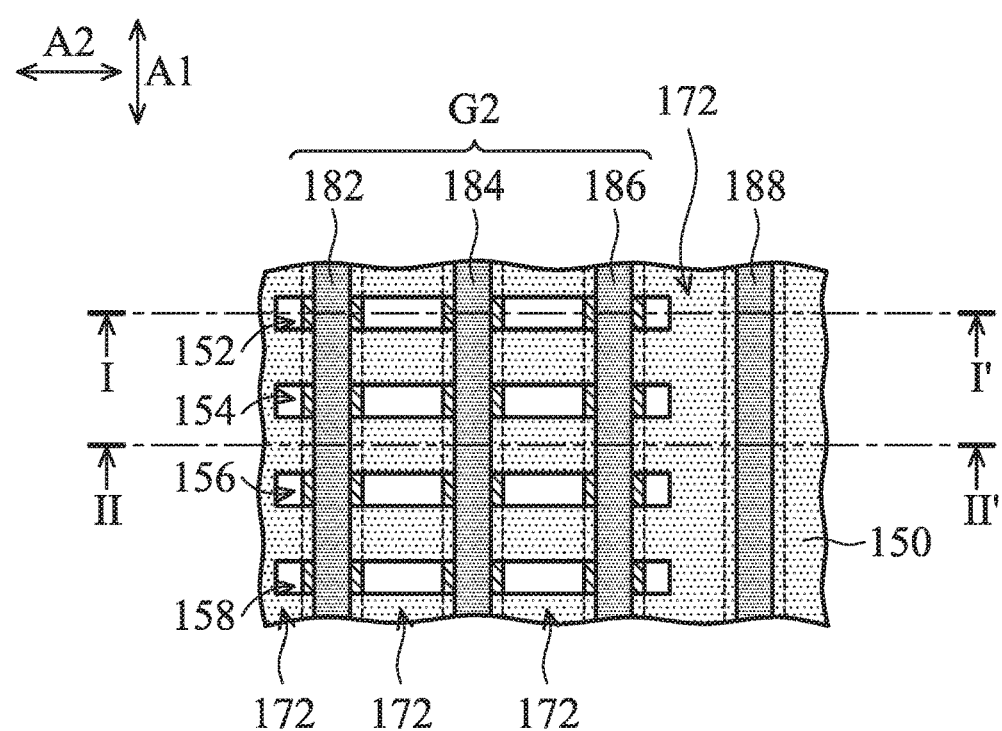
Figure 3C:
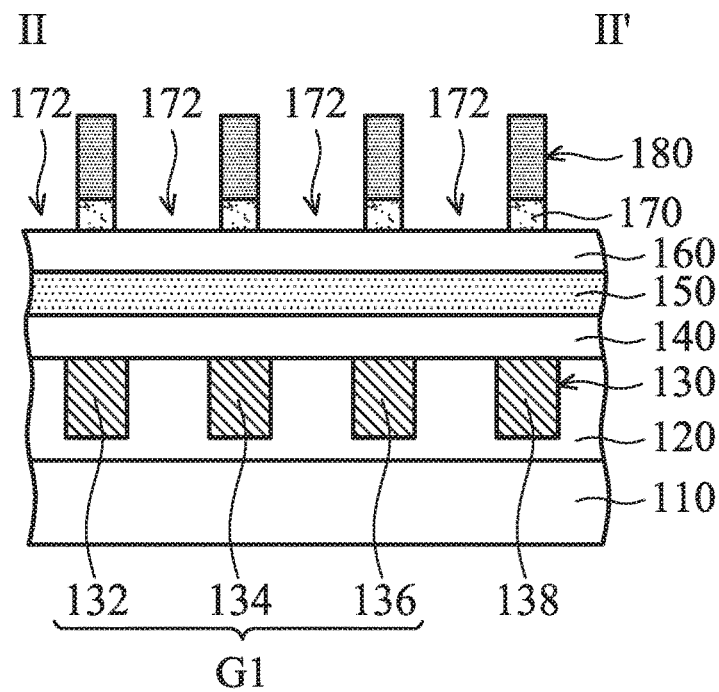

As shown in FIGS. 1E, 2E and 3C, if the measurement result of the optical overlay measurement 190 is acceptable, the layer 170, which is not covered by the material layer 180, is removed to form trenches 172 in the layer 170, in accordance with some embodiments. The removal process includes an etching process, in accordance with some embodiments. For the sake of simplicity, FIG. 2E does not show the layers 140 and 160, in accordance with some embodiments.

Figure 1F:
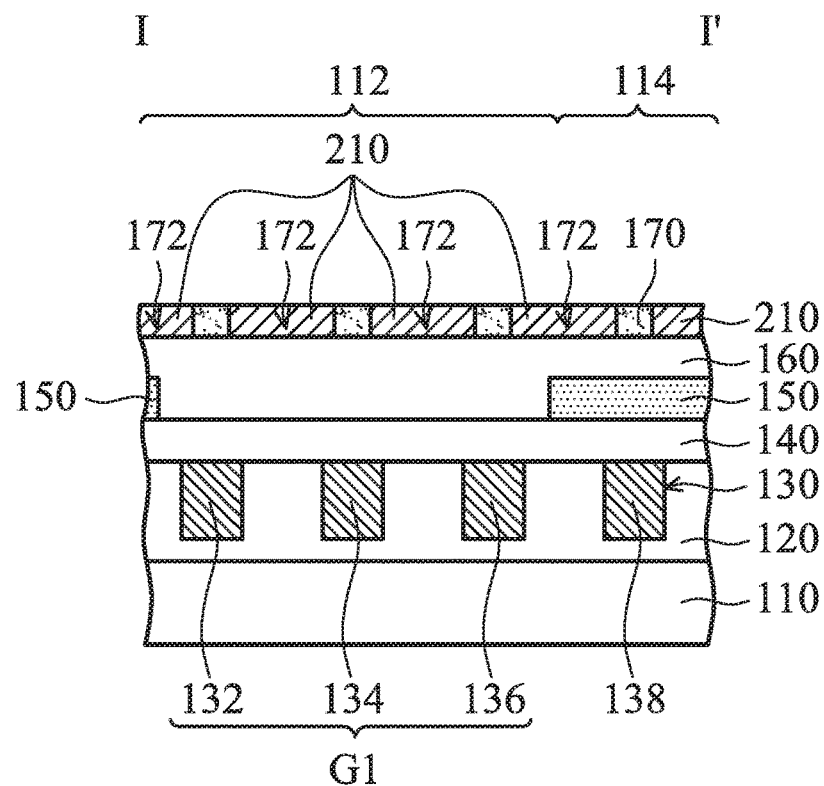
Figure 2F:
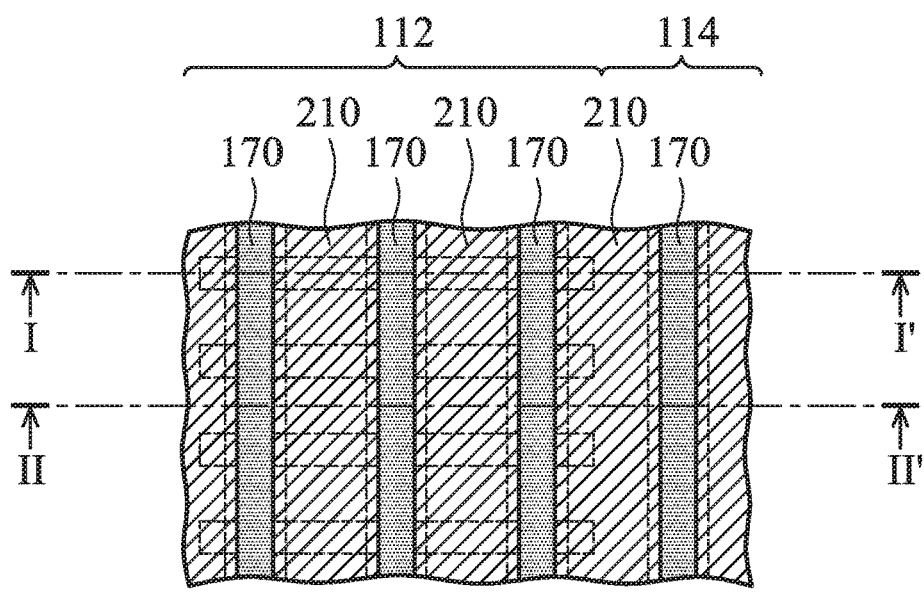
Figure 3D:
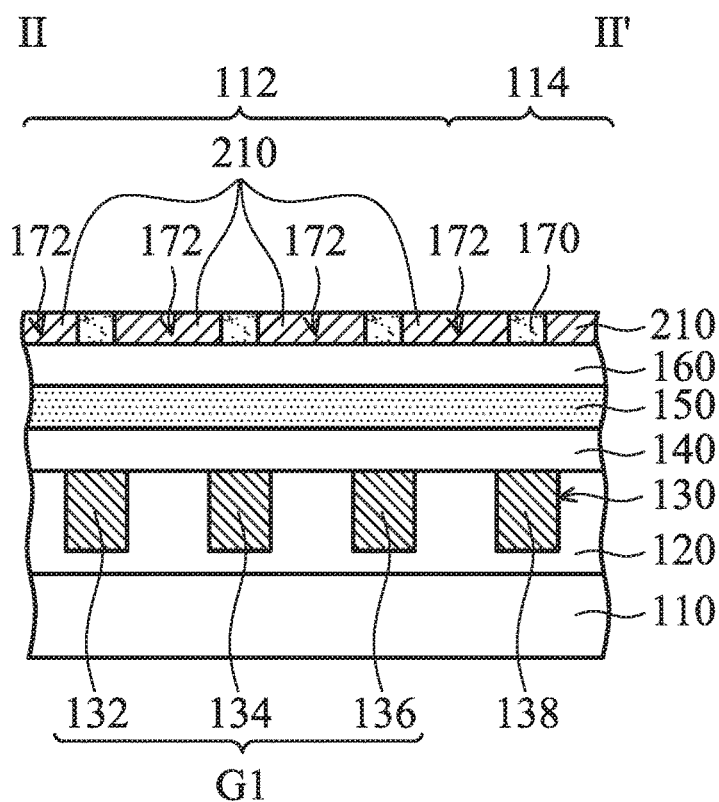

As shown in FIGS. 1F, 2F and 3D, the material layer 180 (including the overlay grating G2) is removed, in accordance with some embodiments. As shown in FIGS. 1F, 2F and 3D, a layer 210 is formed in the trenches 172, in accordance with some embodiments. The layer 210 is made of a conductive material, a semiconductor material, an insulating material, a dielectric material, or another material which is suitable to be formed over the substrate 110. The layer 210 is formed using a physical vapor deposition process, a chemical vapor deposition process, a plating process, a spin coating process, or another process which is suitable to be performed over the substrate 110.

Figure 1G:
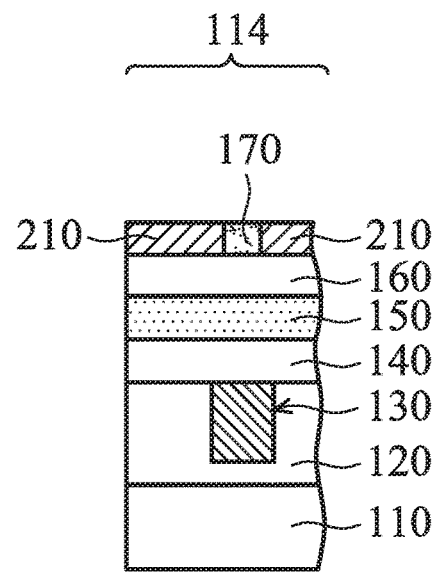
Figure 2G:
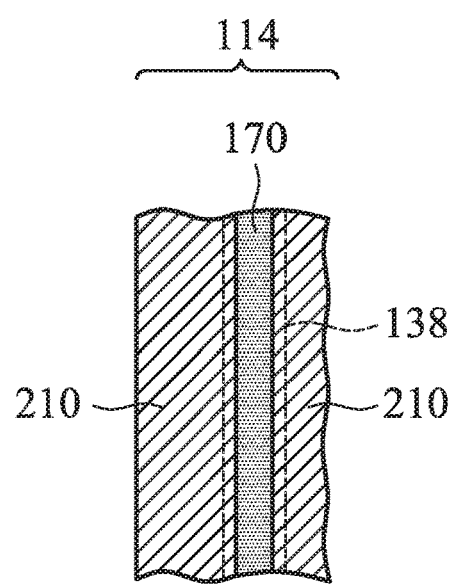
Figure 3E:
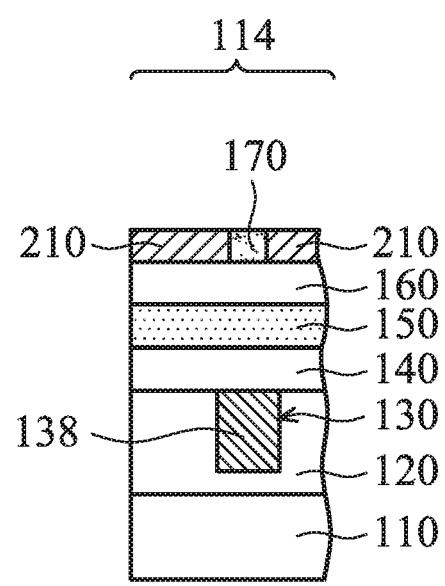

Then, as shown in FIGS. 1G, 2G and 3E, if the region 112 is a scribe line region, a (wafer) cutting process is performed to remove all of the structures in the region 112, in accordance with some embodiments.

Figure 4A:
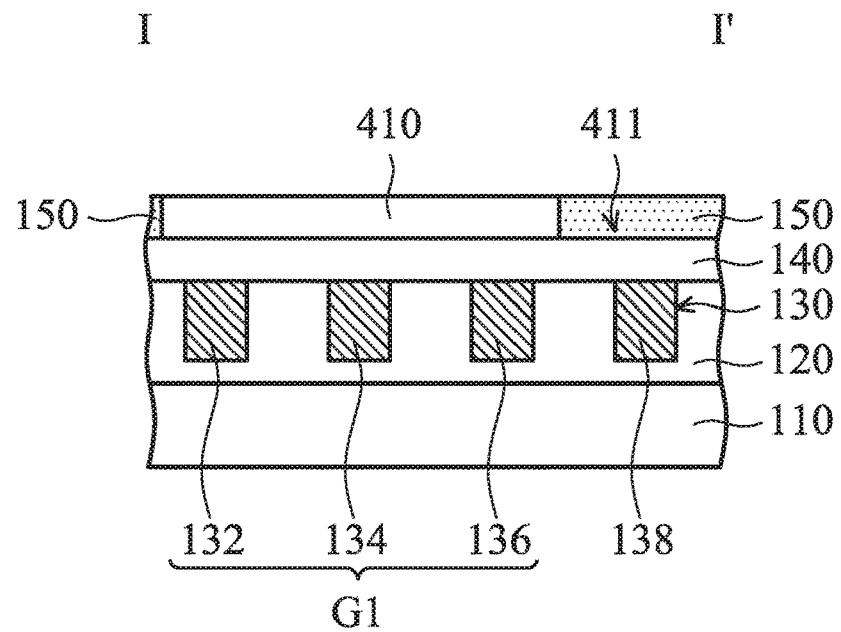
FIGS. 4A-4B are cross-sectional views of various stages of a process for forming a semiconductor device structure, in accordance with some embodiments.
Figure 5A:
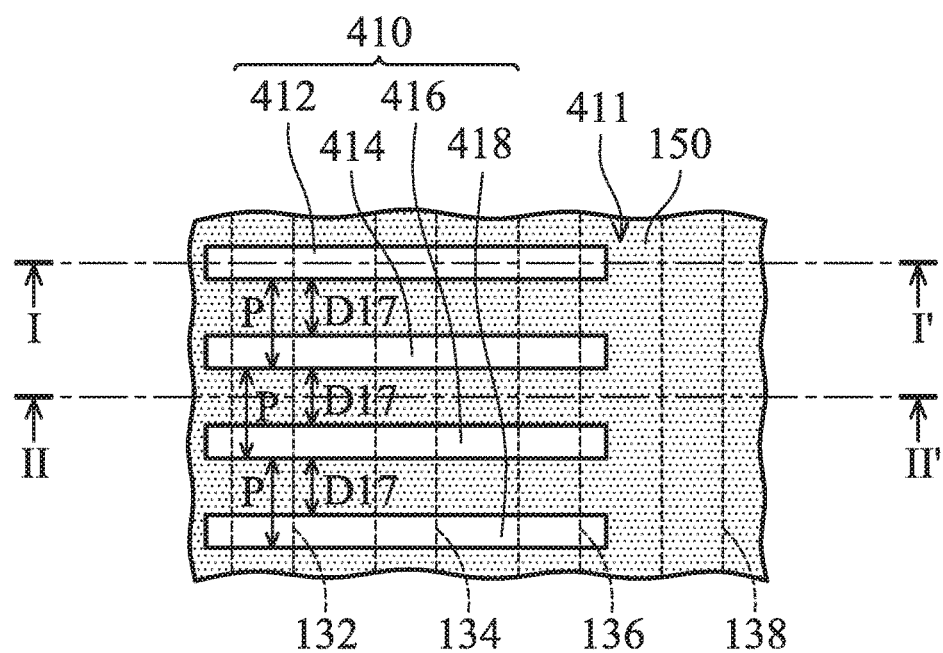
FIGS. 5A-5B are top views of the semiconductor device structures of FIGS. 4A-4B, in accordance with some embodiments.
Figure 4B:
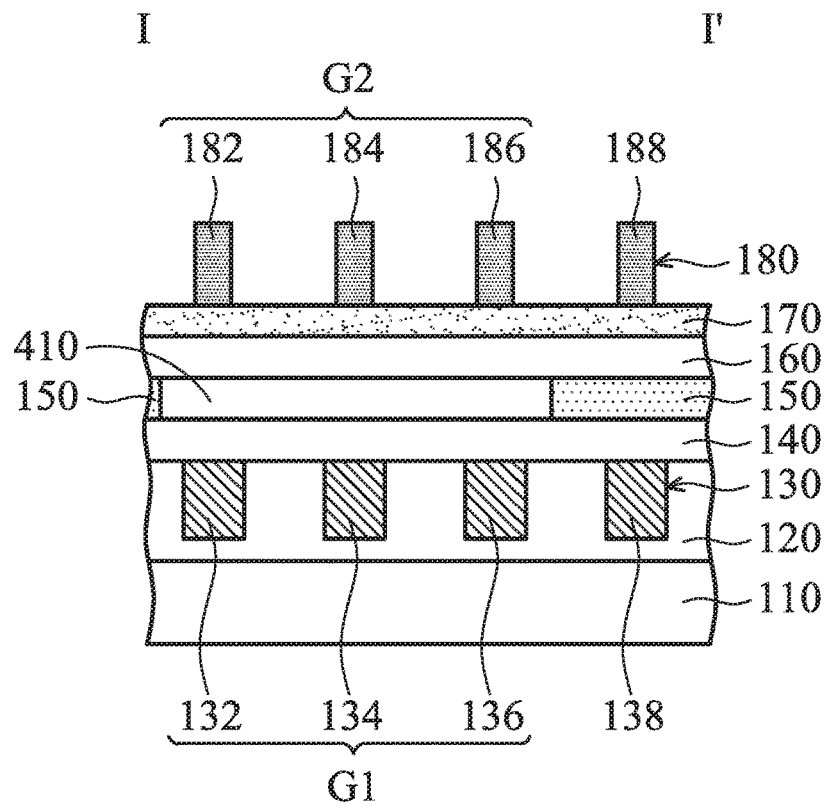
Figure 5B:
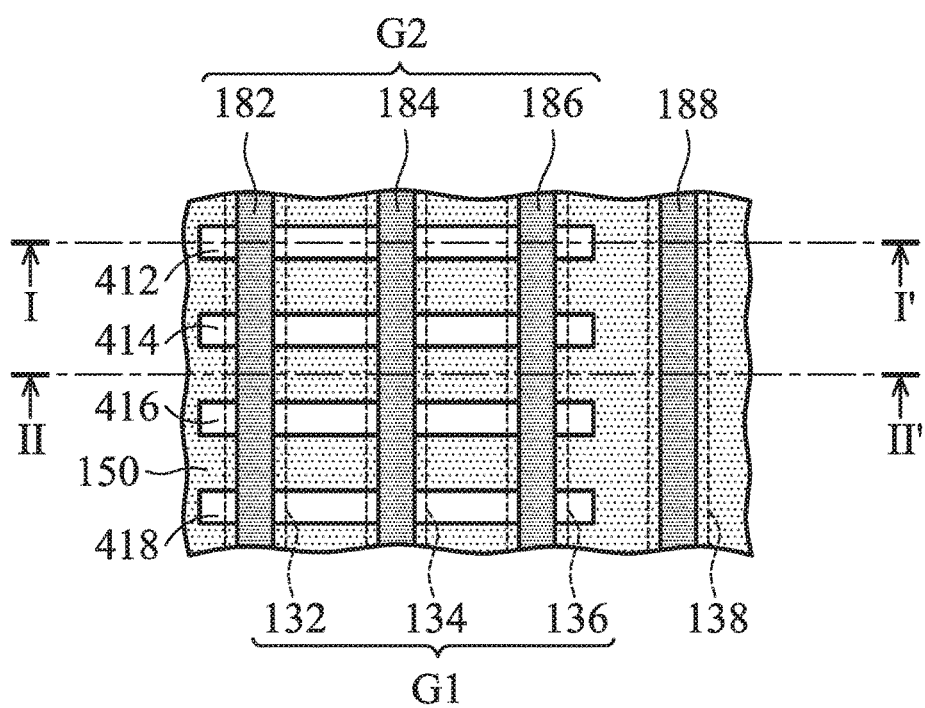
Figure 6A:
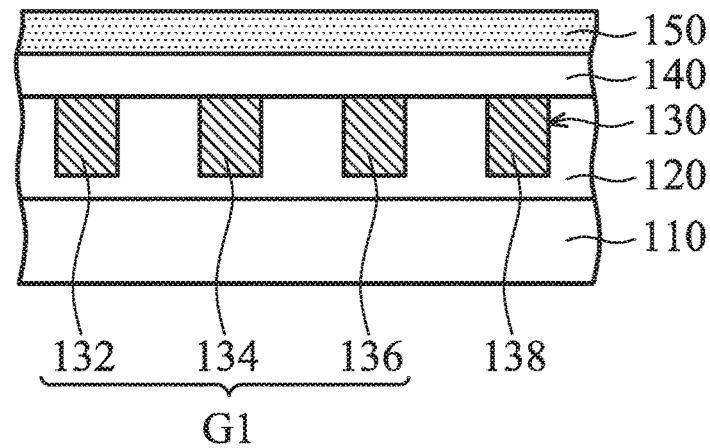
FIGS. 6A-6B are cross-sectional views illustrating the semiconductor device structures along a sectional line II-II' in FIGS. 5A-5B, in accordance with some embodiments.
Figure 6B:
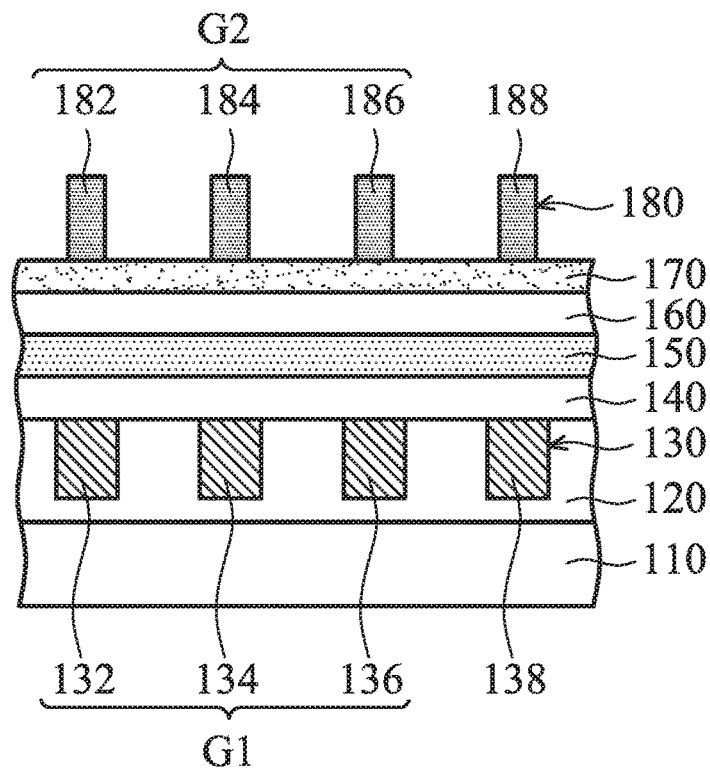

FIGS. 4A-4B are cross-sectional views of various stages of a process for forming a semiconductor device structure, in accordance with some embodiments. FIGS. 5A-5B are top views of the semiconductor device structures of FIGS. 4A-4B, in accordance with some embodiments. FIGS. 4A-4B are cross-sectional views illustrating the semiconductor device structures along a sectional line I-I' in FIGS. 5A-5B, in accordance with some embodiments. FIGS. 6A-6B are cross-sectional views illustrating the semiconductor device structures along a sectional line II-II' in FIGS. 5A-5B, in accordance with some embodiments.

As shown in FIGS. 4A, 5A and 6A, after the step of FIG. 1A, a layer 140 is formed over the material layer 130 (including the overlay grating G1) and the dielectric layer 120, in accordance with some embodiments. The structure and the material of the layer 140 is the same as that of the layer 140 of FIG. 1B, in accordance with some embodiments.

As shown in FIGS. 4A, 5A and 6A, a layer 410 is formed over the layer 140, in accordance with some embodiments. The layer 410 has an opening 411 exposing a portion of the layer 140 thereunder, in accordance with some embodiments. The layer 410 is made of an insulating material, a conductive material, a dielectric material, a semiconductor material, or another material which is suitable to be formed over the substrate 110. The layer 410 is formed using a chemical vapor deposition process, a physical vapor deposition process, a plating process, a spin coating process, or another process which is suitable to be performed over the substrate 110.

As shown in FIGS. 4A, 5A and 6A, a layer 150 is formed in the opening 411, in accordance with some embodiments. The structure and the material of the layer 150 is the same as that of the layer 150 of FIGS. 1C, 2C, and 3A, in accordance with some embodiments. The light transmittance of the layer 150 is lower than the light transmittance of the layer 410 at a wavelength ranging from about 400 nm to about 800 nm, in accordance with some embodiments.

The layer 410 has strip portions 412, 414, 416, and 418, in accordance with some embodiments. The strip portions 412, 414, 416, and 418 are substantially parallel to each other, in accordance with some embodiments. The strip portions 412, 414, 416, and 418 are spaced apart from each other by the same distance D17 or the same pitch P, in accordance with some embodiments.

The strip portions 412, 414, 416, and 418 are substantially perpendicular to the strip portions 132, 134 and 136, and the strip structure 138, in accordance with some embodiments.

The positions, the sizes, the shapes of the strip portions 412, 414, 416, and 418 are respectively the same as that of the trenches 152, 154, 156, and 158 of FIG. 2C, in accordance with some embodiments. Therefore, the position, the size, and the shape of the layer 150 are the same as that of the layer 150 of FIGS. 1C, 2C, and 3A, in accordance with some embodiments.

As shown in FIGS. 4B, 5B and 6B, a step of FIGS. 1D, 2D, and 3B are performed to form layers 160 and 170 and a material layer 180 sequentially over the layers 150 and 410, in accordance with some embodiments. The structures, the materials, and the forming methods of the layers 160 and 170 and the material layer 180 are the same as that of the layers 160 and 170 and the material layer 180 of FIGS. 1D, 2D, and 3B, in accordance with some embodiments. For the sake of simplicity, FIG. 5B does not show the layers 160 and 170, in accordance with some embodiments.

Figure 7A:
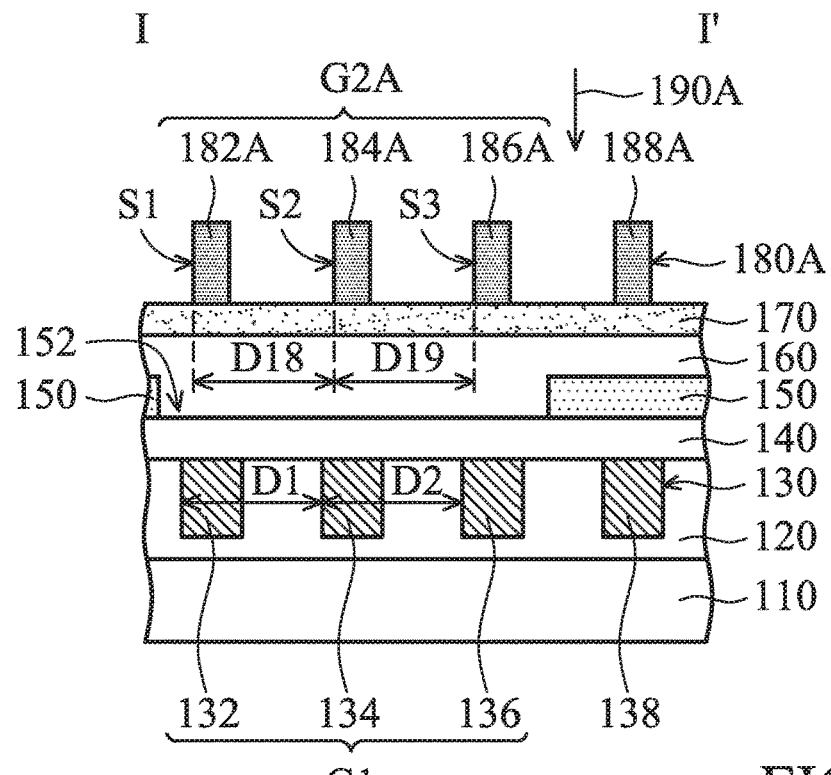
FIGS. 7A-7B are cross-sectional views of various stages of a process for forming a semiconductor device structure, in accordance with some embodiments.
Figure 8A:
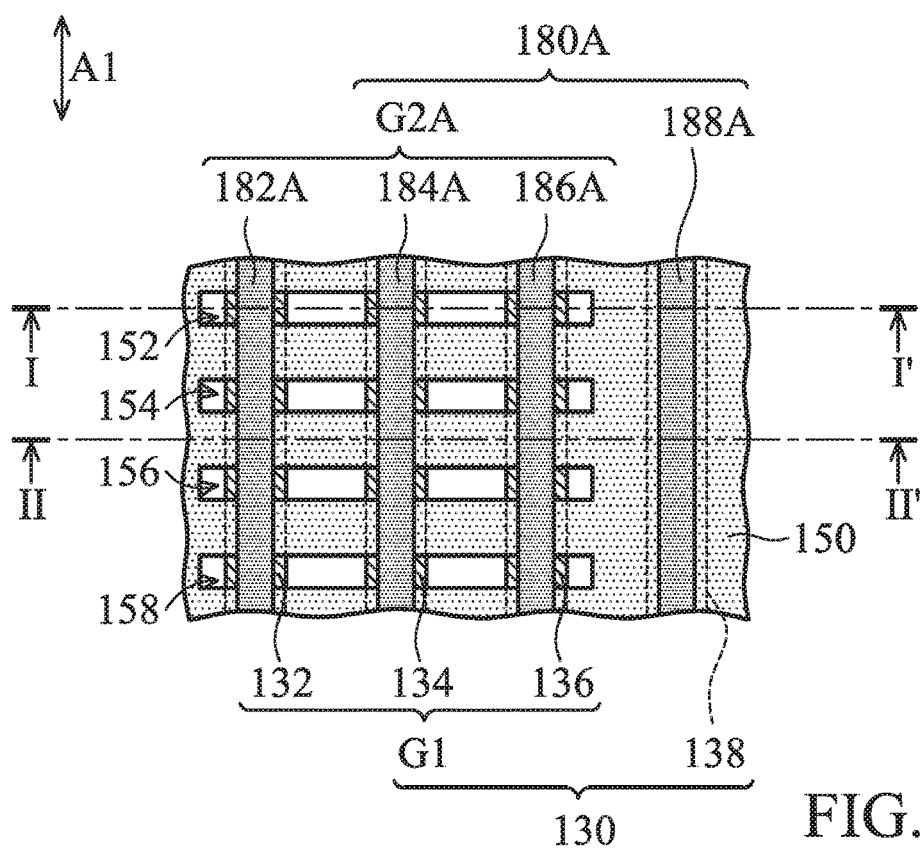
FIGS. 8A-8B are top views of the semiconductor device structures of FIGS. 7A-7B, in accordance with some embodiments.
Figure 7B:
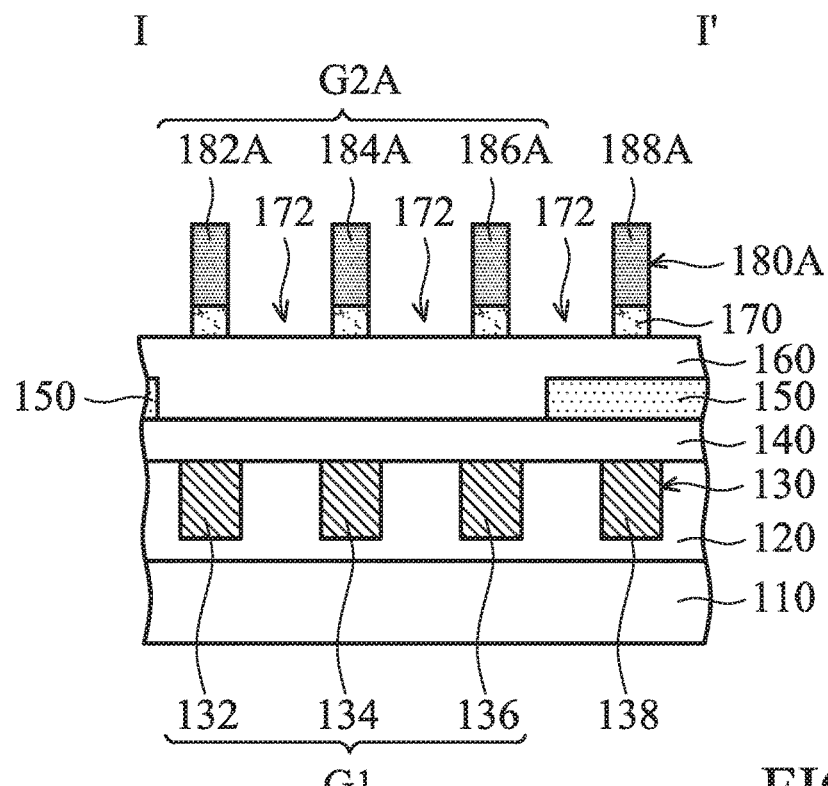
Figure 8B:
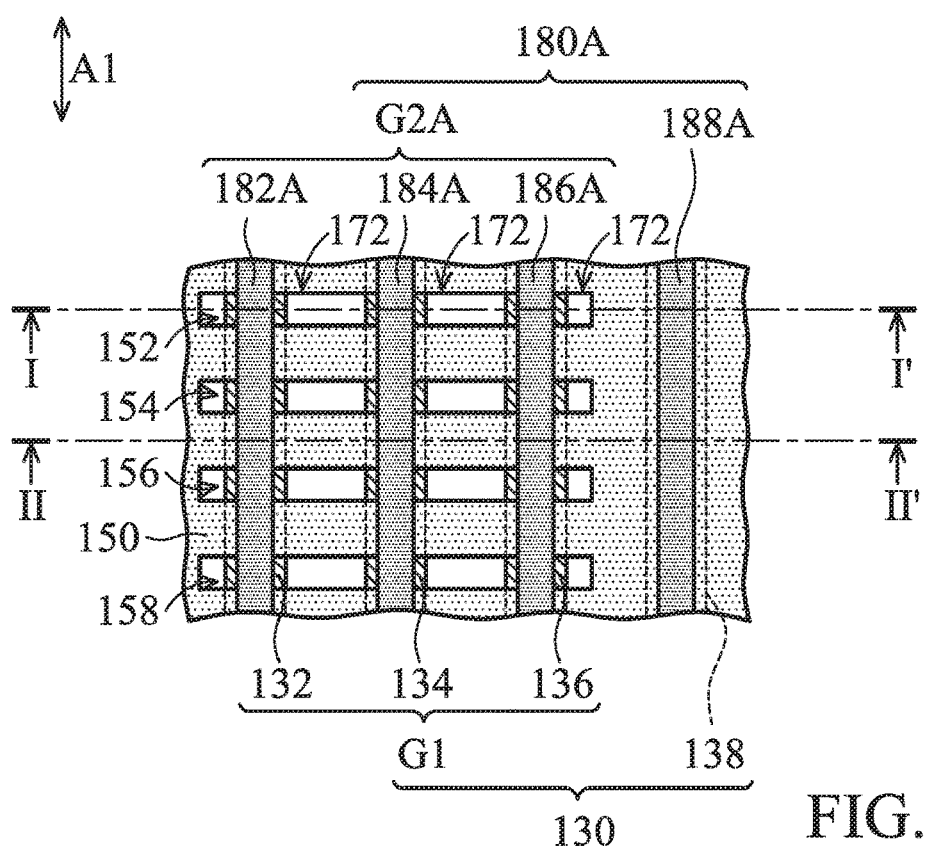
Figure 9A:
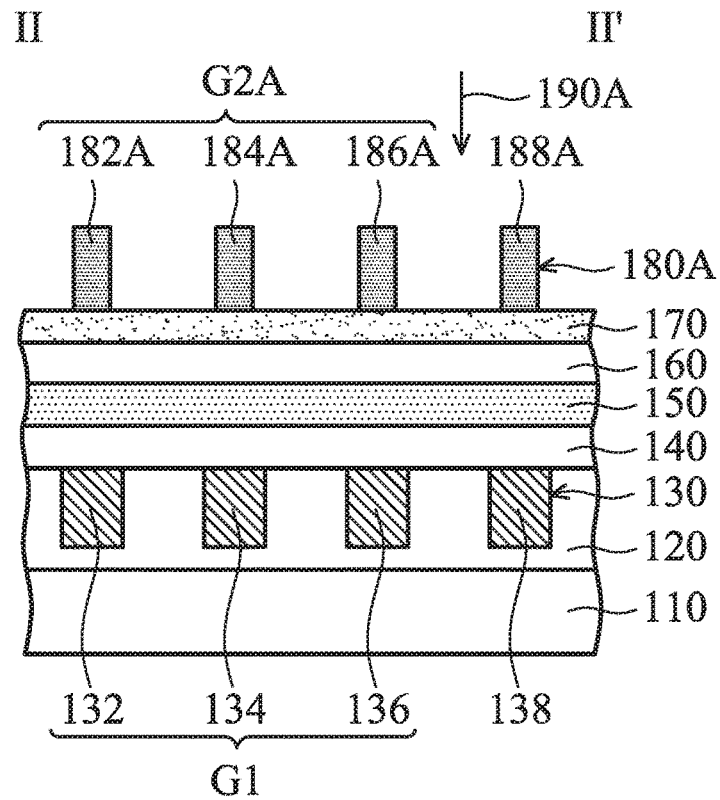
FIGS. 9A-9B are cross-sectional views illustrating the semiconductor device structures along a sectional line II-II' in FIGS. 8A-8B, in accordance with some embodiments.
Figure 9B:
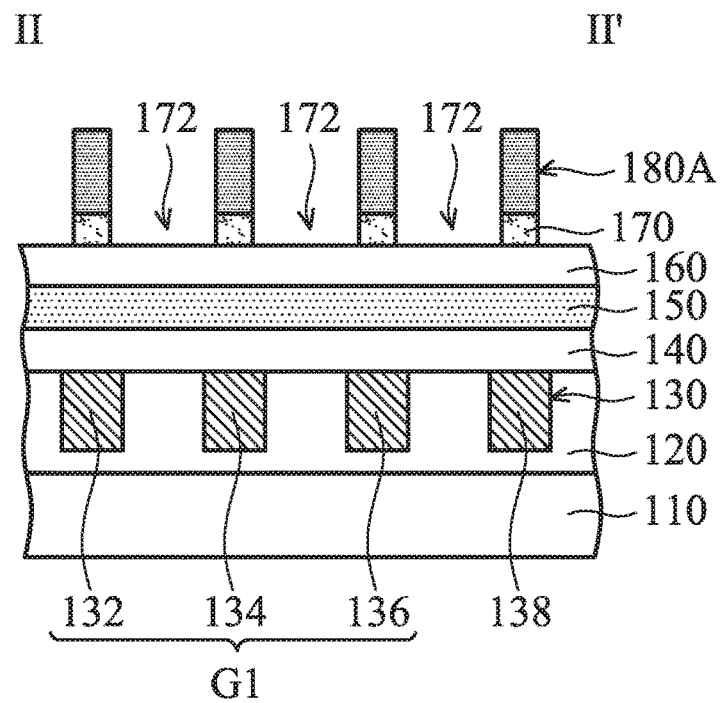

FIGS. 7A-7B are cross-sectional views of various stages of a process for forming a semiconductor device structure, in accordance with some embodiments. FIGS. 8A-8B are top views of the semiconductor device structures of FIGS. 7A-7B, in accordance with some embodiments. FIGS. 7A-7B are cross-sectional views illustrating the semiconductor device structures along a sectional line I-I' in FIGS. 8A-8B, in accordance with some embodiments. FIGS. 9A-9B are cross-sectional views illustrating the semiconductor device structures along a sectional line II-II' in FIGS. 8A-8B, in accordance with some embodiments.

As shown in FIGS. 7A, 8A and 9A, if the measurement result of the optical overlay measurement 190 of FIGS. 1D, 2D and 3B is unacceptable, the material layer 180 (including the overlay grating G2) is removed after the optical overlay measurement 190 of FIGS. 1D, 2D and 3B, in accordance with some embodiments.

As shown in FIGS. 7A, 8A and 9A, a material layer 180A is formed over the layer 170, in accordance with some embodiments. For the sake of simplicity, FIG. 8A does not show the layers 140, 160, and 170, in accordance with some embodiments. The structure, the material, and the forming method of the material layer 180A are the same as that of the material layer 180 of FIGS. 1D, 2D, and 3B, in accordance with some embodiments. A relative position between the material layers 130 and 180A is different from the relative position between the material layers 130 and 180 of FIGS. 1D, 2D and 3B, in accordance with some embodiments.

The material layer 180A includes an overlay grating G2A and a strip structure 188A, in accordance with some embodiments. The overlay grating G2A has strip portions 182A, 184A, and 186A, in accordance with some embodiments. The overlay gratings G1 and G2A are used to measure overlay between the material layers 130 and 180A, in accordance with some embodiments. The strip structure 188A is used to be a mask for forming a device element, in accordance with some embodiments.

The strip portions 182A, 184A, and 186A and the strip structure 188A are elongated in the first elongated axis A1, in accordance with some embodiments. The strip portions 182A, 184A, and 186A and the strip structure 188A are substantially parallel to each other, in accordance with some embodiments. The strip portions 132, 134, 136, 182A, 184A, and 186A and the strip structures 138 and 188A are substantially parallel to each other, in accordance with some embodiments.

The strip portions 132, 134, 136, 182A, 184A, and 186A and the strip structures 138 and 188A are not parallel to the trenches 152, 154, 156, and 158, in accordance with some embodiments. The strip portions 132, 134, 136, 182A, 184A, and 186A and the strip structures 138 and 188A are substantially perpendicular to the trenches 152, 154, 156, and 158, in accordance with some embodiments. The strip portions 182A, 184A, and 186A and the strip structure 188A are spaced apart from each other, in accordance with some embodiments.

There is a distance D18 between a sidewall S1 of the strip portion 182A and a sidewall S2 of the strip portion 184A, in accordance with some embodiments. The sidewall S1 faces away from the strip portion 184A, in accordance with some embodiments. The sidewall S2 faces the strip portion 182A, in accordance with some embodiments.

There is a distance D19 between a sidewall S2 of the strip portion 184A and a sidewall S3 of the strip portion 186A, in accordance with some embodiments. The sidewall S2 faces away from the strip portion 186A, in accordance with some embodiments. The sidewall S3 faces the strip portion 184A, in accordance with some embodiments.

The distance D18 is substantially equal to the distance D19, in accordance with some embodiments. The distance D18 is also referred to as a pitch between the strip portions 182A and 184A, in accordance with some embodiments. The distance D19 is also referred to as a pitch between the strip portions 184A and 186A, in accordance with some embodiments. The distances (or the pitches) D1, D2, D18, and D19 are substantially equal to each other, in accordance with some embodiments.

As shown in FIGS. 7A, 8A and 9A, after the formation of the overlay grating G2A, an optical overlay measurement 190A is performed on the overlay gratings G1 and G2A, in accordance with some embodiments. The optical overlay measurement 190A includes a diffraction based overlay measurement or an image based overlay measurement, in accordance with some embodiments.

As shown in FIGS. 7B, 8B and 9B, if the measurement result of the optical overlay measurement 190A is acceptable, the layer 170, which is not covered by the material layer 180A, is removed to form trenches 172 in the layer 170, in accordance with some embodiments. The removal process includes an etching process, in accordance with some embodiments. For the sake of simplicity, FIG. 8B does not show the layers 140 and 160, in accordance with some embodiments.

Figure 10A:
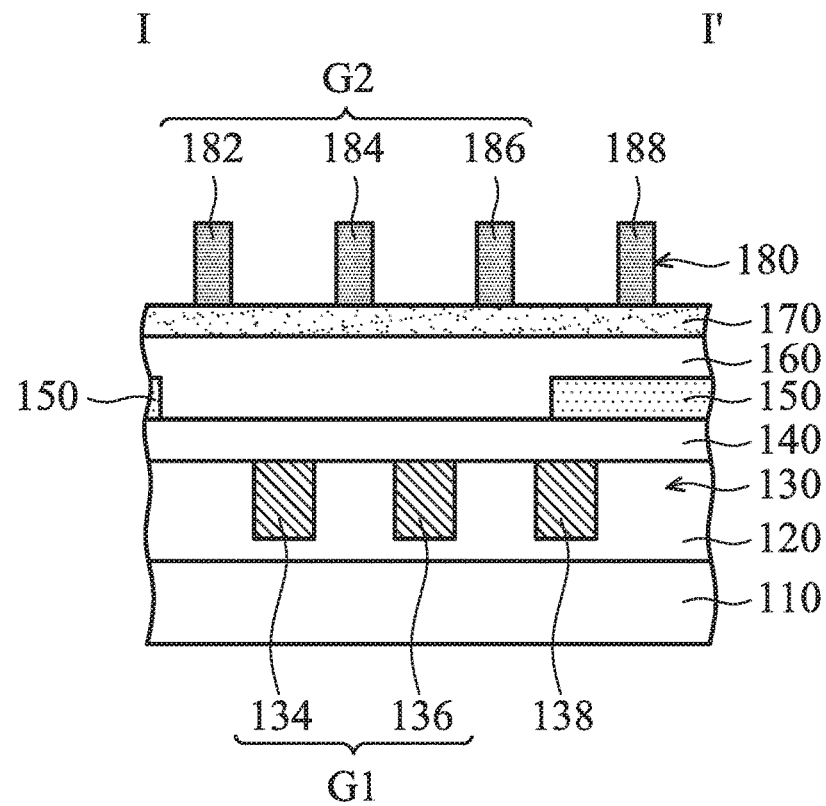
FIG. 10A is a cross-sectional view of a stage of a process for forming a semiconductor device structure, in accordance with some embodiments.
Figure 10B:
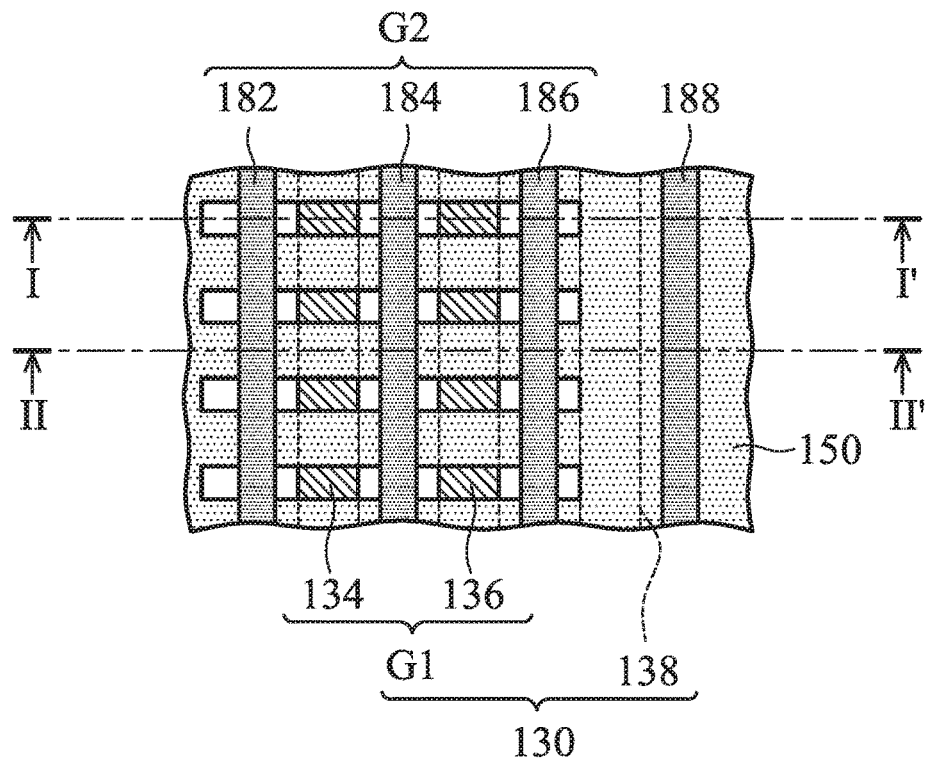
FIG. 10B is a top view of the semiconductor device structure of FIG. 10A, in accordance with some embodiments.
Figure 10C:
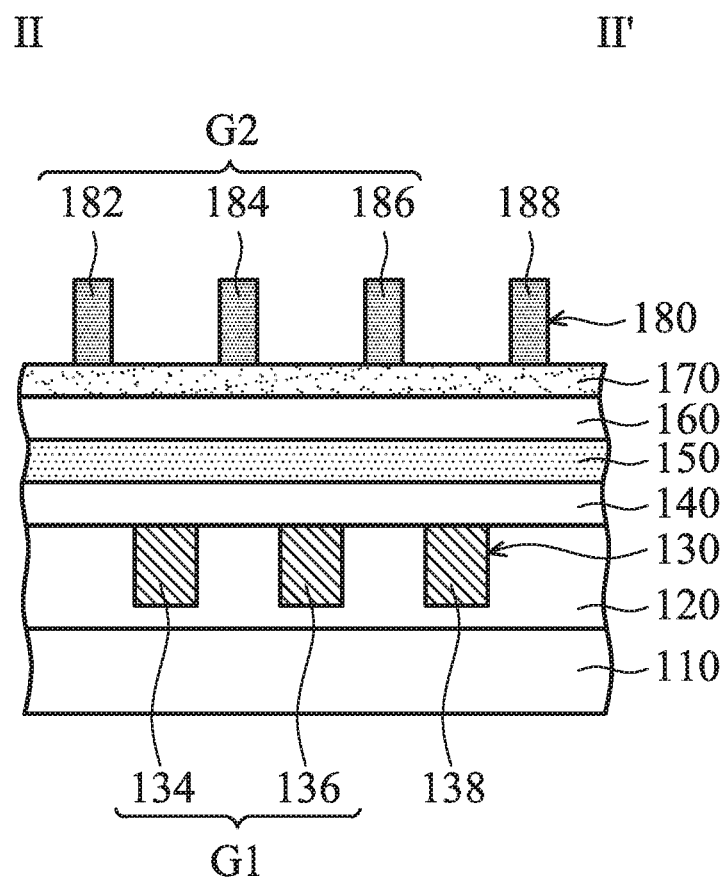
FIG. 10C is a cross-sectional view illustrating the semiconductor device structures along a sectional line II-II' in FIG. 10B, in accordance with some embodiments.

FIG. 10A is a cross-sectional view of a stage of a process for forming a semiconductor device structure, in accordance with some embodiments. FIG. 10B is a top view of the semiconductor device structure of FIG. 10A, in accordance with some embodiments. FIG. 10A is a cross-sectional view illustrating the semiconductor device structure along a sectional line I-I' in FIG. 10B, in accordance with some embodiments. FIG. 10C is a cross-sectional view illustrating the semiconductor device structure along a sectional line II-II' in FIG. 10B, in accordance with some embodiments.

The embodiment of FIGS. 10A, 10B and 10C is similar to the embodiment of FIGS. 1D, 2D and 3B, except that the overlay grating G2 and the strip structure 188 of FIGS. 10A, 10B and 10C does not overlap the overlay grating G1 and the strip structure 138, in accordance with some embodiments. As shown in FIGS. 10A, 10B and 10C, the overlay grating G2 and the strip structure 188 does not directly over the overlay grating G1 and the strip structure 138, in accordance with some embodiments.

Figure 11A:
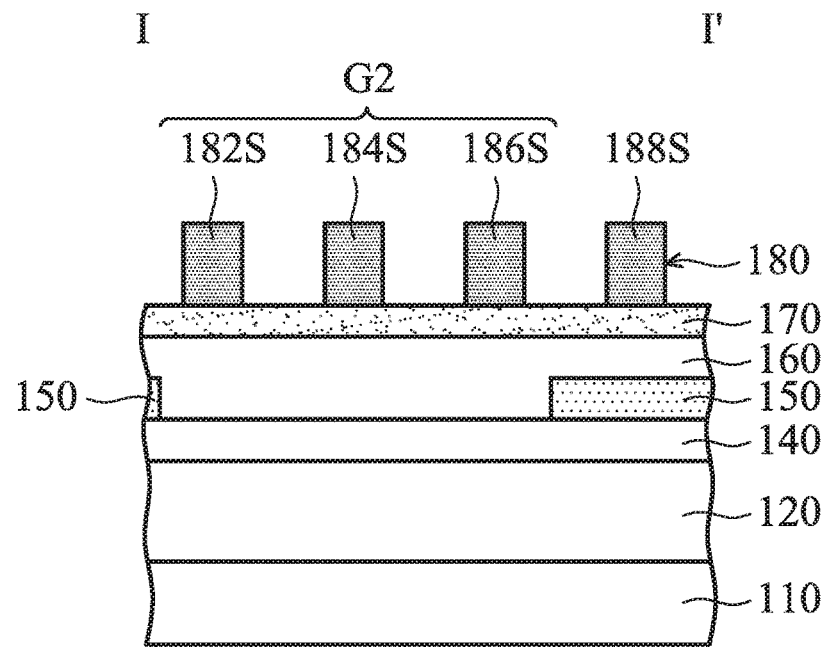
FIG. 11A is a cross-sectional view of a stage of a process for forming a semiconductor device structure, in accordance with some embodiments.
Figure 11B:
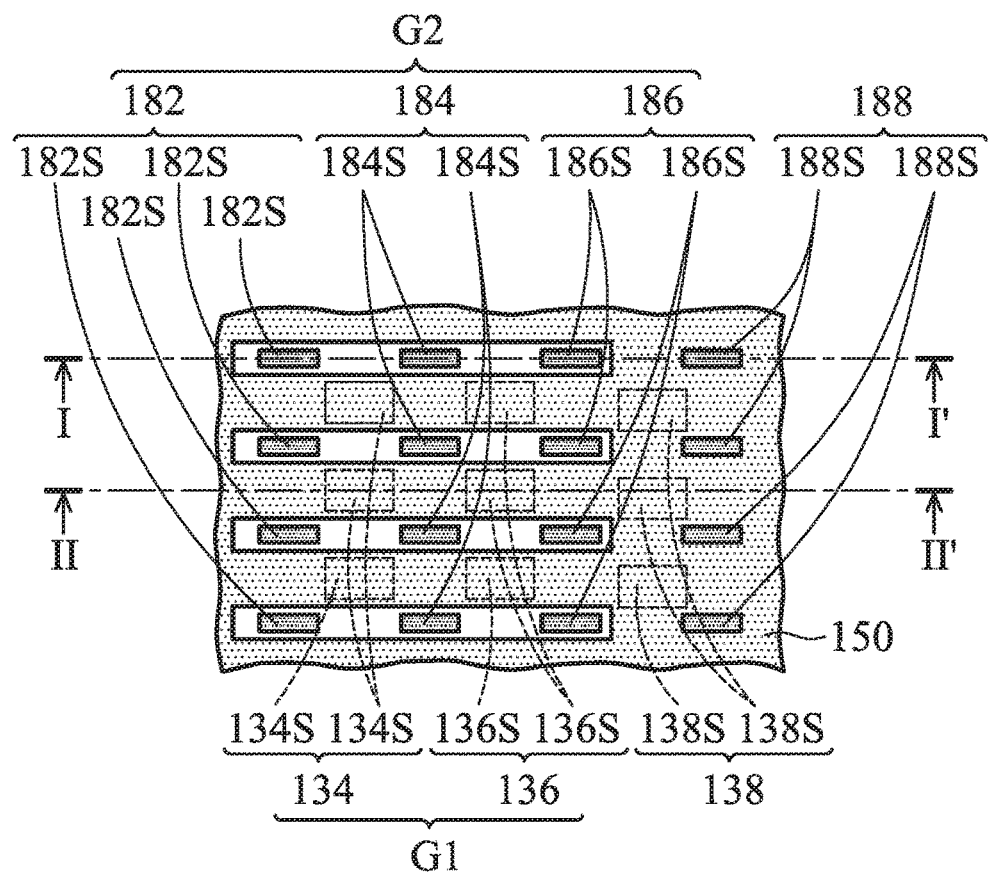
FIG. 11B is a top view of the semiconductor device structure of FIG. 11A, in accordance with some embodiments.
Figure 11C:
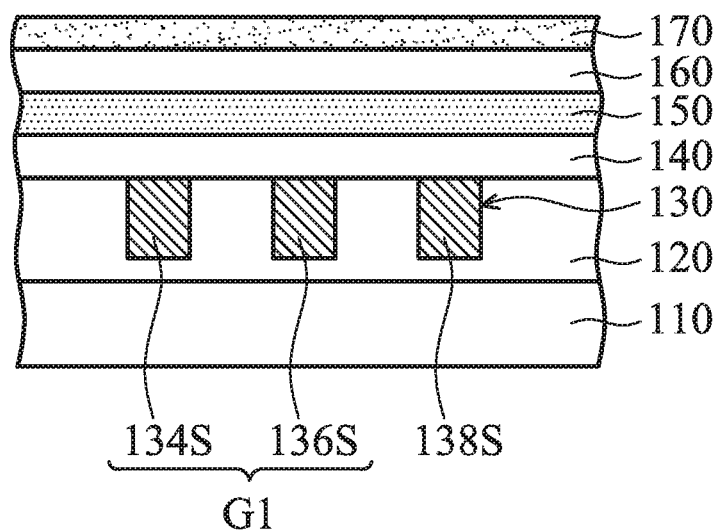
FIG. 11C is a cross-sectional view illustrating the semiconductor device structures along a sectional line II-II' in FIG. 11B, in accordance with some embodiments.

FIG. 11A is a cross-sectional view of a stage of a process for forming a semiconductor device structure, in accordance with some embodiments. FIG. 11B is a top view of the semiconductor device structure of FIG. 11A, in accordance with some embodiments. FIG. 11A is a cross-sectional view illustrating the semiconductor device structure along a sectional line I-I' in FIG. 11B, in accordance with some embodiments. FIG. 11C is a cross-sectional view illustrating the semiconductor device structure along a sectional line II-II' in FIG. 11B, in accordance with some embodiments.

The embodiment of FIGS. 11A, 11B and 11C is similar to the embodiment of FIGS. 10A, 10B and 10C, except that each strip portion 134, 136, 182, 184, or 186 has segments spaced apart from each other, in accordance with some embodiments. As shown in FIGS. 11A, 11B and 11C, the strip portion 134 has segments 134s spaced apart from each other, in accordance with some embodiments. The strip portion 136 has segments 136s spaced apart from each other, in accordance with some embodiments.

The strip portion 182 has segments 182s spaced apart from each other, in accordance with some embodiments. The strip portion 184 has segments 184s spaced apart from each other, in accordance with some embodiments. The strip portion 186 has segments 186s spaced apart from each other, in accordance with some embodiments. The strip structure 188 has segments 188s spaced apart from each other, in accordance with some embodiments. The segments 134s, 136s, 138s, 182s, 184s, 186s, and 188s do not overlap with each other, in accordance with some embodiments.

In accordance with some embodiments, semiconductor device structures and methods for forming the same are provided. The methods (for forming the semiconductor device structure) form trenches in a layer with a lower light transmittance. The layer is between a first overlay grating and a second overlay grating. The first overlay grating and the second overlay grating are respectively formed in different material layers. The formation of the trenches increases the light passing through the layer and illuminating the first overlay grating under the layer. As a result, the formation of the trenches increases the diffraction light or the reflected light from the first overlay grating under the layer. Therefore, the formation of the trenches improves the accuracy of the measurement result of the optical overlay measurement performing over the first overlay grating and the second overlay grating.

In accordance with some embodiments, a method for forming a semiconductor device structure is provided. The method includes forming a first overlay grating over a substrate. The first overlay grating has a first strip portion and a second strip portion, and the first strip portion and the second strip portion are elongated in a first elongated axis and are spaced apart from each other. The method includes forming a layer over the first overlay grating. The layer has a first trench elongated in a second elongated axis, the second elongated axis is substantially perpendicular to the first elongated axis, and the first trench extends across the first strip portion and the second strip portion. The method includes forming a second overlay grating over the layer. The second overlay grating has a third strip portion and a fourth strip portion, the third strip portion and the fourth strip portion are elongated in the first elongated axis and are spaced apart from each other, and the third strip portion and the fourth strip portion extend across the first trench.

In accordance with some embodiments, a method for forming a semiconductor device structure is provided. The method includes forming a first overlay grating over a substrate. The first overlay grating has a first strip portion and a second strip portion, and the first strip portion and the second strip portion are spaced apart from each other. The method includes forming a layer over the first overlay grating. The layer has a first trench, a second trench, and a third strip portion between the first trench and the second trench, and the third strip portion extends across the first strip portion and the second strip portion. The method includes forming a second overlay grating over the layer. The second overlay grating has a fourth strip portion and a fifth strip portion, the fourth strip portion and the fifth strip portion are spaced apart from each other and extend across the third strip portion, and the first strip portion, the second strip portion, the fourth strip portion, and the fifth strip portion are substantially parallel to each other.

In accordance with some embodiments, a method for forming a semiconductor device structure is provided. The method includes forming a first overlay grating over a substrate. The first overlay grating has a first strip portion and a second strip portion, and the first strip portion and the second strip portion are spaced apart from each other and substantially parallel to each other. The method includes forming a layer over the first overlay grating. The layer has a trench and a third strip portion adjacent to the trench, and the trench and the third strip portion extend across the first strip portion and the second strip portion. The method includes forming a second overlay grating over the layer. The second overlay grating has a fourth strip portion and a fifth strip portion, the fourth strip portion and the fifth strip portion are spaced apart from each other and substantially parallel to each other, and the fourth strip portion and the fifth strip portion extend across the trench and the third strip portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first overlay grating over a substrate, wherein the first overlay grating has a first strip portion and a second strip portion, and the first strip portion and the second strip portion are elongated in a first elongated axis and are spaced apart from each other;
    forming a layer over the first overlay grating, wherein the layer has a first trench elongated in a second elongated axis, the second elongated axis is substantially perpendicular to the first elongated axis, and the first trench extends across the first strip portion and the second strip portion; and
    forming a second overlay grating over the layer, wherein the second overlay grating has a third strip portion and a fourth strip portion, the third strip portion and the fourth strip portion are elongated in the first elongated axis and are spaced apart from each other, and the third strip portion and the fourth strip portion extend across the first trench.

2. The method for forming the semiconductor device structure as claimed in claim 1, wherein there is a first distance between a first sidewall of the first strip portion and a second sidewall of the second strip portion, the first sidewall faces away from the second strip portion, the second sidewall faces the first strip portion, there is a second distance between a third sidewall of the third strip portion and a fourth sidewall of the fourth strip portion, the third sidewall faces away from the fourth strip portion, the fourth sidewall faces the third strip portion, and the first distance is substantially equal to the second distance.

3. The method for forming the semiconductor device structure as claimed in claim 2, wherein an inner wall of the first trench is substantially perpendicular to the first sidewall of the first strip portion.

4. The method for forming the semiconductor device structure as claimed in claim 3, wherein the inner wall of the first trench is substantially perpendicular to the third sidewall of the third strip portion.

5. The method for forming the semiconductor device structure as claimed in claim 1, wherein the layer further has a second trench elongated in the second elongated axis, and the second trench extends across the first strip portion and the second strip portion.

6. The method for forming the semiconductor device structure as claimed in claim 5, wherein there is a third distance between a first inner wall of the first trench and a second inner wall of the second trench, the first inner wall faces away from the second trench, the second inner wall faces the first trench, and the third distance is less than the second distance.

7. The method for forming the semiconductor device structure as claimed in claim 5, wherein the third strip portion and the fourth strip portion further extend across the second trench.

8. The method for forming the semiconductor device structure as claimed in claim 5, wherein the first trench and the second trench have a substantially same length.

9. The method for forming the semiconductor device structure as claimed in claim 1, wherein the first strip portion and the second strip portion have a substantially same first line width.

10. The method for forming the semiconductor device structure as claimed in claim 9, wherein the third strip portion and the fourth strip portion have a substantially same second line width, and the second line width is less than the first line width.

11. A method for forming a semiconductor device structure, comprising:
forming a first overlay grating over a substrate, wherein the first overlay grating has a first strip portion and a second strip portion, and the first strip portion and the second strip portion are spaced apart from each other;
forming a layer over the first overlay grating, wherein the layer has a first trench, a second trench, and a third strip portion between the first trench and the second trench, and the third strip portion extends across the first strip portion and the second strip portion; and
forming a second overlay grating over the layer, wherein the second overlay grating has a fourth strip portion and a fifth strip portion, the fourth strip portion and the fifth strip portion are spaced apart from each other and extend across the third strip portion, and the first strip portion, the second strip portion, the fourth strip portion, and the fifth strip portion are substantially parallel to each other.

12. The method for forming the semiconductor device structure as claimed in claim 11, wherein there is a first distance between a first sidewall of the first strip portion and a second sidewall of the second strip portion, the first sidewall faces away from the second strip portion, the second sidewall faces the first strip portion, there is a second distance between a third sidewall of the fourth strip portion and a fourth sidewall of the fifth strip portion, the third sidewall faces away from the fifth strip portion, the fourth sidewall faces the fourth strip portion, and the first distance is substantially equal to the second distance.

13. The method for forming the semiconductor device structure as claimed in claim 12, wherein the first trench and the second trench extend across the first strip portion and the second strip portion, and the fourth strip portion and the fifth strip portion extend across the first trench and the second trench.

14. The method for forming the semiconductor device structure as claimed in claim 11, wherein the first strip portion, the second strip portion, the fourth strip portion, and the fifth strip portion are substantially perpendicular to the third strip portion.

15. A method for forming a semiconductor device structure, comprising:
forming a first overlay grating over a substrate, wherein the first overlay grating has a first strip portion and a second strip portion, and the first strip portion and the second strip portion are spaced apart from each other and substantially parallel to each other;
forming a layer over the first overlay grating, wherein the layer has a trench and a third strip portion adjacent to the trench, and the trench and the third strip portion extend across the first strip portion and the second strip portion; and
forming a second overlay grating over the layer, wherein the second overlay grating has a fourth strip portion and a fifth strip portion, the fourth strip portion and the fifth strip portion are spaced apart from each other and substantially parallel to each other, and the fourth strip portion and the fifth strip portion extend across the trench and the third strip portion.

16. The method for forming the semiconductor device structure as claimed in claim 15, wherein the first strip portion, the second strip portion, the fourth strip portion, and the fifth strip portion are substantially parallel to each other and are not parallel to the third strip portion.

17. The method for forming the semiconductor device structure as claimed in claim 15, wherein the fourth strip portion and the fifth strip portion continuously extend across an inner wall of the trench.

18. The method for forming the semiconductor device structure as claimed in claim 15, wherein a first portion of the trench is between the first strip portion and the fourth strip portion, and a second portion of the trench is between the second strip portion and the fifth strip portion.

19. The method for forming the semiconductor device structure as claimed in claim 15, wherein there is a first distance between a first sidewall of the first strip portion and a second sidewall of the second strip portion, the first sidewall faces away from the second strip portion, the second sidewall faces the first strip portion, there is a second distance between a third sidewall of the fourth strip portion and a fourth sidewall of the fifth strip portion, the third sidewall faces away from the fifth strip portion, the fourth sidewall faces the fourth strip portion, and the first distance is substantially equal to the second distance.

20. The method for forming the semiconductor device structure as claimed in claim 15, wherein the first strip portion is wider than the fourth strip portion.

\* \* \* \* \*